(12) United States Patent
Birnstock et al.

(10) Patent No.: US 9,318,705 B2
(45) Date of Patent: Apr. 19, 2016

(54) ORGANIC LIGHT EMITTING DEVICE WITH ROUGHENING LAYER AND METHOD OF PRODUCING

(71) Applicant: Novaled GmbH, Dresden (DE)

(72) Inventors: Jan Birnstock, Dresden (DE); Sven Zimmermann, Dresden (DE); Domagoj Pavicic, Dresden (DE); Mauro Furno, Dresden (DE); Thomas Rosenow, Dresden (DE)

(73) Assignee: NOVALED GMBH, Dresden (DE)

( * ) Notice: Subject to any disclaimer, the term of this patent is extended or adjusted under 35 U.S.C. 154(b) by 0 days.

(21) Appl. No.: 14/363,251

(22) PCT Filed: Dec. 6, 2012

(86) PCT No.: PCT/EP2012/074674
§ 371 (c)(1),
(2) Date: Jun. 5, 2014

(87) PCT Pub. No.: WO2013/083712
PCT Pub. Date: Jun. 13, 2013

(65) Prior Publication Data
US 2014/0332794 A1    Nov. 13, 2014

(30) Foreign Application Priority Data

Dec. 6, 2011  (EP) ..................................... 11192234
Dec. 7, 2011  (EP) ..................................... 11192480

(51) Int. Cl.
  *H01L 51/52* (2006.01)
  *H01L 51/56* (2006.01)
  *H01L 51/00* (2006.01)

(52) U.S. Cl.
  CPC ............ *H01L 51/0014* (2013.01); *H01L 51/52* (2013.01); *H01L 51/5268* (2013.01); *H01L 51/5225* (2013.01); *H01L 2251/56* (2013.01)

(58) Field of Classification Search
  CPC ............ H01L 51/5268; H01L 51/5209; H01L 51/5225

USPC ............................................... 257/40; 438/29
See application file for complete search history.

(56) References Cited

U.S. PATENT DOCUMENTS

| 5,093,698 A | 3/1992 | Egusa |
| 6,693,296 B1 | 2/2004 | Tyan |

(Continued)

FOREIGN PATENT DOCUMENTS

| EP | 1 804 309 A1 | 7/2007 |
| GB | 2 400 235 A | 10/2004 |

(Continued)

OTHER PUBLICATIONS

PCT International Search Report for PCT Application No. PCT/EP2012/074674 mailed Mar. 8, 2013 (3 pages).

(Continued)

*Primary Examiner* — Thao X Le
*Assistant Examiner* — J. R. Oakley
(74) *Attorney, Agent, or Firm* — Sutherland Asbill & Brennan LLP

(57) ABSTRACT

The invention relates to an organic light emitting device, in a layered structure, comprising a substrate, a bottom electrode, a top electrode, wherein the bottom electrode is closer to the substrate than the top electrode, an electrically active region, the electrically active region comprising one or more organic layers and being provided between and in electrical contact with the bottom electrode and the top electrode, a light emitting region provided in the electrically active region, and a roughening layer, the roughening layer being provided as non-closed layer in the electrically active region and providing an electrode roughness to the top electrode by roughening the top electrode on at least one an inner side facing the electrically active region and an outer side of the top electrode facing away from the electrically active region. Furthermore, a further organic light emitting device, and a method of producing an organic light emitting device are provided.

11 Claims, 17 Drawing Sheets

(56) References Cited

U.S. PATENT DOCUMENTS

| | | |
|---|---|---|
| 6,908,783 B1 | 6/2005 | Kuehl et al. |
| 7,074,500 B2 | 7/2006 | Pfeiffer et al. |
| 7,345,300 B2 | 3/2008 | Qin et al. |
| 7,911,129 B2 | 3/2011 | Hofmann et al. |
| 7,986,090 B2 | 7/2011 | Pfeiffer et al. |
| 8,134,146 B2 | 3/2012 | Limmert et al. |
| 8,237,158 B2 | 8/2012 | Chao |
| 8,258,501 B2 | 9/2012 | Werner et al. |
| 8,431,046 B2 | 4/2013 | Zeika et al. |
| 2006/0250076 A1 | 11/2006 | Hofmann et al. |
| 2007/0051846 A1 | 3/2007 | Box et al. |
| 2007/0069199 A1* | 3/2007 | Choulis et al. ............... 257/40 |
| 2008/0122347 A1* | 5/2008 | Lee ............................. 313/504 |
| 2008/0203406 A1 | 8/2008 | He et al. |
| 2008/0227979 A1 | 9/2008 | Saalbeck et al. |
| 2008/0265216 A1 | 10/2008 | Hartmann et al. |
| 2009/0009072 A1 | 1/2009 | Wellmann et al. |
| 2009/0045728 A1 | 2/2009 | Murano et al. |
| 2010/0141123 A1* | 6/2010 | Joo et al. ..................... 313/504 |
| 2010/0224313 A1 | 9/2010 | Chari et al. |
| 2012/0091436 A1* | 4/2012 | Forrest et al. ................ 257/40 |
| 2012/0126263 A1* | 5/2012 | Chao ........................... 257/98 |
| 2012/0223296 A1 | 9/2012 | Werner et al. |
| 2013/0193414 A1 | 8/2013 | Werner et al. |
| 2014/0061592 A1* | 3/2014 | Liu et al. ..................... 257/40 |

FOREIGN PATENT DOCUMENTS

| | | |
|---|---|---|
| JP | 2004-349064 A | 12/2004 |
| JP | 2011-154843 A | 8/2011 |
| WO | 2005/106987 A1 | 11/2005 |

OTHER PUBLICATIONS

Kafer, "Characterization and Optimization of Growth and Electronic Structure of Organic Thin Films for Applications in Organic Electronics," Ruhr-University Bochum, 2008, Section 3.1.2, pp. 49-58, 142, and 149.

Vogel, "Co-Deposited Films of Rod-Like Conjugated Molecules: From Phase Separation to Mixing," Humbolt-Universität Berlin, 2009, pp. 15-17 and 26.

Witte et al., "Growth of Aromatic Molecules on Solid Substrates for Applications in Organic Electronics," Journal of Materials Research, 2004, 19(7):1889-1916.

\* cited by examiner

200nm

ORGANIC LIGHT EMITTING DEVICE WITH ROUGHENING LAYER AND METHOD OF PRODUCING

CROSS-REFERENCE TO RELATED APPLICATIONS

This is a submission pursuant to 35 U.S.C. 154(d)(4) to enter the national stage under 35 U.S.C. 371 for PCT/EP2012/074674, filed Dec. 6, 2012. Priority is claimed under 35 U.S.C. 119(a) and 35 U.S.C. 365(b) to European Application No. 11 192 234.0, filed Dec. 6, 2011 and European Application No. 11 192 480.9, filed Dec. 7, 2011. The subject matters of PCT/EP2012/074674 and European Applications No. 11 192 234.0 and 11 192 480.9 are incorporated herein by reference.

FIELD OF THE INVENTION

The present disclosure refers to an organic light emitting device and method of producing.

BACKGROUND

Organic semiconductors are used in the production of simple electronic components e.g. resistors, diodes, field effect transistors, and also optoelectronic components like organic light emitting devices, e.g. OLED (organic light emitting diodes), and many others. The industrial and economical significance of the organic semiconductors and their devices is reflected in the increased number of devices using organic semiconducting active layers and the increasing industry focus on the subject.

Organic semiconductor devices are made by layers; such organic semiconducting layers mainly comprise conjugated organic compounds, which can be small molecules, for instance monomers, or oligomers, polymers, copolymers, copolymers of conjugated and non-conjugated blocks, completely or partially cross-linked layers, aggregate structures, or brush like structures. A device made with different types of compounds, in different layers or mixed together, for example with polymer and small molecule layers, is also called a polymer—small molecule hybrid device. OLEDs are preferentially made of small molecules because the deposition techniques involved in fabricating small molecule OLEDs enable the fabrication of multilayer structures.

Since 1987, large efforts were undertaken worldwide by research groups and by industrial organizations to improve the performance of OLEDs, especially of small molecule OLEDs. One of the first quests was to find suitable organic semiconductor materials made of small molecules which are able to form homogeneous layers. Nowadays, charge carrier transporting materials for industrial use are morphologically stable at least to the temperature of 85° C., typical materials have glass transition temperatures above 100° C. At the same time the materials need to fulfill a set of other requirements, such as high transparency in the visible spectrum and good charge transporting abilities.

Most of the good performance electron or hole transport materials are relatively high cost materials mainly due to their complex synthetic route, which presents a problem to be solved.

Another problem to be solved is the enhancement of the outcoupling efficiency of OLEDs to be used in lighting. Typical organic light-emitting diodes have the disadvantage that only about 25% of the light produced is emitted from the device. About 50% of the light remains as internal modes in the arrangement of organic layers located between the reflecting electrode and the semitransparent electrode. A further 20% is lost due to total reflection in the substrate. The reason for this is that the light inside an OLED is formed in optical media having a refractive index of about 1.6 to 1.8. If this light now impinges upon an optical medium having a lower refractive index, for example, another layer inside an OLED stack, the substrate on which the OLED is formed or one of the electrodes, total reflection occurs if a certain value of the angle of incidence is exceeded. For improving outcoupling, several different techniques are used, for instance, micro lenses array, as described, e.g. in document US 2010/0224313 A1. However such techniques require further development because light extraction efficiency is still far from 100%.

For the use of OLEDs in the lighting and display field, it is therefore necessary to use suitable outcoupling methods which could furthermore be incorporated inexpensively in the fabrication process. It is assumed that, for lighting applications, an OLED area of 1 cm2 must only cost a few cents in order for its application to be economically reasonable. This means, however, that only particularly inexpensive methods come into consideration at all for increasing the light outcoupling. OLEDs based on so-called small molecules (SM) are nowadays processed with, i.a., the aid of thermal evaporation in vacuum. Typically, OLEDs consist of two to twenty layers which are all individually thermally vapour-deposited. If the outcoupling can now be significantly improved by means of just one more single thermally vapour-deposited layer, the condition on the costs of the outcoupling method will be satisfied in any case. The same applies to SM-polymer hybrid OLEDs.

For applications of OLEDs as lighting elements, it is furthermore necessary to make the devices having a large-area. For instance, if an OLED is operated at a brightness of 1000 cd/m2, areas in the range of a few square meters are required to illuminate an office space.

BRIEF SUMMARY

It is an object of the invention to provide an organic light emitting device with improved efficiency of coupling out the light generated in the light emitting region (outcoupling efficiency).

According to one aspect, an organic light emitting device comprising a layered structure is provided. The layered structure comprises a substrate, a bottom electrode, a top electrode, wherein the bottom electrode is closer to the substrate than the top electrode, and an electrically active region. The electrically active region comprises one or more organic layers and is provided between and in electrical contact with the bottom electrode and the top electrode, a light emitting region provided in the electrically active region. There is a roughening layer provided as non-closed layer in the electrically active region. The term "non-closed" as used here refers to a layer made of roughening structures protruding from the underlying layer and separated from each other by spaces free of roughening structures. It may be that in the spaces free of the roughening structures there is a flat, very thin ground layer having the same chemical composition as the roughening structures have and with a layer thickness of less than 5 nm. Such ground layer, for example, may be due one or more molecular monolayers deposited in the process of the production of the roughening layer.

DETAILED DESCRIPTION

The roughening layer causes the top electrode to be provided with an electrode roughness by roughening the top electrode on at least one an inner side facing the electrically active region and an outer side of the top electrode facing away from the electrically active region.

The top electrode roughness may comprise roughened inner surface structures on the inner side of the top electrode which is facing the electrically active region. The top electrode roughness may comprise roughened outer surface structures on the outer side of the top electrode. Looking from above on the electrode, the roughened inner surface structures and the roughened outer surface structures may essentially overlap.

According to another aspect, an organic light emitting device comprising a layered structure is provided. The layered structure comprises a substrate, a bottom electrode, a top electrode, wherein the bottom electrode is closer to the substrate than the top electrode, and an electrically active region. The electrically active region comprises one or more organic layers and is provided between and in electrical contact with the bottom electrode and the top electrode, a light emitting region provided in the electrically active region. There is a roughening layer provided as non-closed, electrically inactive layer between the substrate and the bottom electrode. The roughening layer causes at least the bottom electrode to be provided with an electrode roughness by roughening the bottom electrode on at least one an inner side facing the electrically active region and an outer side of the bottom electrode facing away from the electrically active region. For the bottom electrode the outer electrode side is facing the substrate. For this device, the roughening layer may also cause the top electrode being provided with electrode roughness on at least one the inner side facing the electrically active region and the outer side of the top electrode facing away from the electrically active region. In addition to the roughening layer underneath the bottom electrode, there may be a further roughening layer provided within the electrically active region. The further roughening layer may be provided according to one or more embodiments described in relation to the roughening layer causing electrode roughness for the top electrode.

Because of the non-closed structure of the roughening layer, such layer may not cover the underlying layer completely. An island or particle structure may be provided comprising material islands/particles separated by regions not covered by the roughening structures. Such regions may be free of the material of the roughening layer. The regions free of the material of the roughening layer may be provided by holes present in the roughening layer.

The organic light emitting devices may be provided with more than one roughening layer. There may be more than one roughening layers provided in the electrically active region. The plurality of roughening layers may be provided above and/or underneath the light emitting region.

The electrode roughness caused by the roughening layer may be provided with light reflection surface structures reflecting light, e.g. diffusely. The structures of the roughening layer itself may reflect light generated in the device. As an alternative, the structures of the roughening layer itself may essentially be free of active light reflection.

One or more layers deposited directly on the roughening layer in the electrically active region may be provided as a closed layer. As an alternative, the layer(s) may be a non-closed layer in which the particles forming the roughening layer provide an iceberg structure. The structures of the roughening layer extend through the one or more layers deposited directly on the roughening layer.

The roughness structures of the electrode may be of a dimension on the order of magnitude of the thickness of the electrode layer. The respective electrode may only be roughened at the positions where a particle of the roughening layer is present underneath, otherwise it may be flat. The surface roughness can be measured for example by a profilometer (e.g. Dektak) or by an electron microscopy cross section image of a device.

The thickness of an electrode provided with a roughness caused by the roughening layer may be provided with a layer thickness much higher than the nominal layer thickness of the roughening layer.

The roughening layer may be provided with a plurality of separated particles (islands) randomly distributed over an underlying layer on which the roughening layer is deposited. The roughening layer may also be referred to as "particle layer". The plurality of separated particles may be provided random in orientation, distance from each other (space between the particles) and/or particle size. The separated particles distributed over the underlying layer provide an island structure for the roughening layer. The size of the particles may be in the range of the wavelength of the visible light, preferentially of the light being emitted by the organic light emitting device, which wavelength may be the wavelength in the organic medium surrounding the particles or the wavelength in the material of the particles.

The particles of the roughening layer may have a lateral dimension of about 50 to about 500 nm and/or a height of about 3 to about 50 nm, preferably of about 3 to about 15 nm. The particle density inside the organic light emitting device may be between 5 to 50 particles per $\mu m^2$, preferably between 10 to 30 particles per $\mu m^2$. The particles may have a dimension of up to 1000 nm. Those dimensions may provide for Mie scattering, that occurs preferentially on objects which have a diameter on the order of the wavelength of the visible light (between 450 and 700 nm), divided by the refractive index of the surrounding organic material.

The top electrode may be provided on a top layer of the electrically active region which is roughened by the roughening layer provided underneath the top layer. The top electrode may be in direct contact with the top layer. In other embodiments, there may be one or more layers provided between the top electrode and the top layer of the electrically active region. The top electrode may be made of a single layer or a plurality of electrode layers.

The top electrode may be provided directly on the roughening layer.

The top layer may be a combined light emitting and electron transport layer. The top layer, being provided as a single layer or a plurality of sub-layers, may be a closed layer. As an alternative, the top layer may be a non-closed layer in which the particles forming the roughening layer provide an iceberg structure. Such iceberg structure would lead to direct contact between the top electrode and the iceberg areas.

The roughening layer may be provided between the light emitting region and the top electrode.

The roughening layer may be provided between the light emitting region and the bottom electrode. In case there are more than one roughening layers, one roughening layer may be provided above the light emitting region, and one other roughening layer may be provided below the light emitting region.

The roughening layer may be provided with a nominal layer thickness of from about 3 nm to about 50 nm, preferably from about 3 nm to about 15 nm. The thickness of the roughening layer is the nominal thickness, such thickness is usually calculated from the mass deposited on a certain area by the knowledge of the material's density. For example, with vacuum thermal evaporation VTE, the nominal thickness is the value indicated by the thickness monitor equipment. The particles of the roughening layer may be grown on a surface of the layer beneath, which particles are apart from each other and do not coalesce forming a closed layer.

Also, the nominal thickness of the roughening layer may be derived from AFM measurements.

The roughening layer may be provided on or may be covered by an electrically doped charge carrier transport layer. The roughening layer may be sandwiched between two electrically doped charge carrier transport layers, the two electrically doped layers being hole and/or electron transport layers. The top layer may be electrically doped single layer or a plurality of electrically doped sub-layers. The roughening layer may be provided on a light emitting layer.

The roughening layer may be provided in between and in direct contact with either an electron transport layer and a cathode, or a hole transport layer and an anode. The transport layers may be electrically doped. The roughening layer may be undoped.

The roughening layer may be made from a self-crystallizing material. The roughening layer made from the self-crystallizing material may be arranged adjacent to the hole transport layer. It may be in direct contact with the hole transport layer. Hereby, the outcoupling of light is increased. Alternatively, the roughening layer made from the self-crystallizing material may be arranged on the electron transport side of the device, in particular adjacent to the electron transport layer.

In order to maximize the outcoupling from an organic light emitting device it is necessary to minimize the internal absorption and to enable the light extraction of wave guided modes and surface plasmon modes. For addressing these optical modes the roughening layer(s) provide for a modification of the conventional flat organic light emitting device structures. In a conventional organic light emitting device two flat electrodes are deposited on a flat substrate sandwiching flat organic layers between them. In this arrangement wave guided modes, i.e. light propagation modes in the organic layers and potentially also the semitransparent electrode, e.g. ITO, as well as surface plasmon modes (light propagation modes in the surface plasmons of the usually metallic electrodes) can easily couple to the emitters in the organic light emitting diode. Light traveling in these modes can then not be easily coupled out into air modes any more, which limits the light conversion efficiency of organic light emitting device significantly.

The architecture of the organic light emitting device proposed here allows for a simple structuring of at least one of the top electrode layer(s) and the bottom electrode layer(s). Such roughness structuring minimizes plasmonic losses and enhances the outcoupling of wave guided modes. Through this approach a roughness of the electrode layer(s) is achieved which may act as scattering center/structure for both the wave guided modes as well as the surface plasmon modes.

As a result of the use of the roughening layer(s), not only the light outcoupling is improved but also the angular dependence of the light emission may be improved. White light spectrum contains components of several light colours, typically however at least some blue, green and red light components. Since the emission characteristic is different for different wavelengths, different colours are seen at different viewing angles in conventional OLEDs. This may drastically be reduced by the scattering properties of the device proposed here.

The roughening layer(s) may improve the outcoupling of internal modes. It also may improve the outcoupling of substrate modes. The roughening layer(s) may be used so that the electronic properties of the OLED are not disturbed. It was further determined that an additional power gain may be achieved with an outcoupling film, which cannot be achieved with usual outcoupling solutions (conventional scattering layers). In contrast, in conventional OLEDs with simple conventional scattering layers, there is no power gain if another additional outcoupling film is used.

A simple structure is provided to produce highly efficient organic light emitting devices without requiring expensive methods, for example, microstructuring of the electrode-side substrate surface or the semiconductor-side electrode surface. A flat (non-microstructured) bottom electrode can also be used. Microstructuring is understood to mean structures which have a size in the range of optical wavelengths in order to influence the light.

All organic layers in the electronically active region may be fabricated by means of evaporation in vacuum (VTE—vacuum thermal evaporation). Alternatively, all the organic layers in the arrangement of stacked layers can be fabricated by means of OVPD. In a preferred embodiment all the organic layers and both electrodes are deposited in a vacuum coating process, for example, VTE or sputtering.

The roughening layer may be formed as vapour-deposited layer from an organic material which can be evaporated by means of thermal evaporation in vacuum. For this purpose the material has an evaporation (or sublimation) temperature in vacuum that is lower than the decomposition temperature in vacuum. Alternatively or additionally, the roughening organic layer may be fabricated by means of OVPD. The roughening layer may be created through dewetting, e.g. of films made through spincoating and subsequent thermal treatment (e.g. a 5% solution of (Spiro-TTB) in Anisole). Furthermore a dewetting of an organic film on nanoscale might be achieved through condensation of a solvent from the vapor.

The roughening layer may be formed by one of vapor condensation of metal nitride nanoparticles, electro-deposition, vacuum spray-coating, photolithography, and printing (e.g. micro-contact printing of nanoparticles arrays).

It is preferred that the roughening organic layer is made of an organic material which has a Tg below about 40° C. Preferably a material having no Tg is used. In this way, the organic material can crystallize out itself during vapour deposition onto the substrate without any further tempering step since in conventional VTE systems the substrate temperature is usually between 20° C. and 60° C.

The Tg is determined by means of a DSC measurement. The DSC measurement is performed using a material which after fusing, is brought to room temperature by means of shock cooling. Thereafter the material is heated during the measurement at a rate of 10 K/min. In the preferred materials used in the roughening organic layer, no Tg was observed.

It is preferred that the roughening layer crystallizes during the vapour deposition. Alternatively, a tempering step can follow after the completion of the layer and before the deposition of the next layer.

Following, further aspects of the disclosure are described in detail.

The roughening layer may be covered by a charge carrier transport layer such that the charges are flowing around these roughening particles, they might however also be directly covered by the metal electrode. The realization of such structures may be realized through the use of p- and n-type doped transport layers, as the doping of the charge transport layers enables the saturation of potential charge carrier traps that might form at the surface of the roughening particles.

The separated structures (particles, islands) of the roughening layer preferably show a minimized absorption in the visible range to avoid absorptive light losses. The refractive index of the particles may be chosen such that the scattering of wave guided modes at the particles is either minimized, i.e. the refractive index of the roughening particles should match the refractive index of the organic layers of the organic light emitting device, or maximized, i.e. the refractive index contrast to the organic layers of the organic light emitting device needs to be maximized. In the first case the wave guided modes are not scattered by the roughening particles but only through the roughness of the metal electrodes, in the latter case scattering of the wave guided modes can occur by the roughening particles directly.

The deposited particles of the roughening layer(s) may have a round shape without any pronounced spikes or edges that might lead to a shortcut formation or an unfavorable roughness profile in the cathode. The roughening particles could either be prolate or oblate spheroids or crystallites with well defined edges, e.g. needles, tetrahedrons, octagons, etc. Such shapes may be achieved, for example, by dewetting due to the surface tension. The same is true for printing processes under correct set of parameters, choice of proper materials (how do they crystallize).

The described outcoupling methods may be combined with other methods known to a person skilled in the art such as microlens array films or scattering substrates.

The particles of the roughening layer may grow broader than high (e.g. width to height ratio 5:1 to 1:1). If the particles are higher than broad they should have a width to height ratio of 1:1 to 1:5 in order to avoid a disruption or puncture of the top electrode.

The organic light emitting device may be provided with at least one of the following features:
- There is a glass transition temperature of at least 300 K below the melting temperature. Preferably the material does not present any measurable glass transition temperature at temperatures above room temperature and changes from the glassy state direct to the crystalline state or is not known in a glassy state at all.
- There is a high transparency also defined as a low extinction coefficient (smaller than 0.1) for all visible light.
- No apparent color.
- A HOMO-LUMO gap of at least 3 eV.
- The material is transparent in the visible region (optical gap >3 eV).
- There is a LUMO smaller than 2.0 eV (in absolute values), which is atypical for ETMs used in OLED, or a HOMO greater than 5.5 eV (in absolute values) which is atypical for HTMs used in OLED.
- The molecular mass of the organic materials used for electrically doping in the transport layers is greater than 200 g/mol and smaller than 400 g/mol (<200 g/mol are compounds with too high volatility and >400 g/mol are compounds which do not crystallize sufficiently).

When a dewetting mechanism is used to form the particles of the roughening layer, the material of the particles may have a high Tg, e.g. higher than 85° C. such that it is stable under conventional device operation. An example of the dewetting approach is 2,2',7,7'-tetrakis(N,N-di-p-methylphenyl-amino)-9,9'-spirobifluorene layers from anisole solution.

In one embodiment, the top electrode is an anode and the material of the roughening layer is an electron transporting material, i.e., the barrier for hole injection into the HOMO of the material of the scattering layer is so high, that it does not contribute to the hole transport in the device. It is specially surprising that this embodiment works at all, that shows that, the material of the scattering layer does not need to have any electronical function in the device.

In another embodiment, the top electrode is a cathode and the material of the roughening layer is a hole transporting material, i.e., the barrier for electron injection into the LUMO of the material of the scattering layer is so high, that it does not contribute to the electron transport in the device. This is surprising as explained above.

For use of the scattering or roughening compound in the electronically active region of an organic light emitting device, it is preferred that, for the roughening layer, the nominal layer thickness is less than 50 nm, even more preferably less than 10 nm. If the layer comprising the roughening compound serves as a template it was found that the best device performance is obtained when the roughening layer is provided between a first and a second electron transport layer, and wherein the nominal thickness of the roughening layer is greater or equal to 3 nm and smaller or equal to 30 nm, preferably between 5 nm and 15 nm.

The particle size may be such to achieve structures on the electrode of the size in the range of optical wavelengths, in the surrounding organic medium, in order to influence the light. Preferentially, the width (parallel to the substrate plane) of features is in the range of the optical wavelength, in the surrounding organic medium. The height may be lower than the width, for example lower by a factor 2 or 3. The particles and the respective features on the layers above, such as the top electrode, are randomly distributed. As a rule, the refractive index of the organic medium is typically between 1.7 and 2, 1.7 is a good approximation in most of the cases.

The wavelength can also be the wavelength in the material of the particles, especially if there is no layer between the roughening layer and the top electrode. Preferentially the particles have at least one dimension between 100 to 450 nm.

The roughening structures may have the size to influence the plasmons in the top electrode. The height may be lower than the width, for example lower by a factor 2 or 3. The particles and the respective features on the layers above, such as the top electrode, are randomly distributed.

In general, the organic light emitting device (OLED) is based on the principle of electroluminescence in which electron-hole pairs, so-called excitons, recombine under the emission of light. To this end the organic light emitting device is constructed in the form of a sandwich structure wherein at least one organic film is arranged as active material between two electrodes, positive and negative charge carriers are injected into the organic material and a charge transport takes place from holes or electrons to a recombination zone (light emitting layer) into the organic layer where a recombination of the charge carriers to singlet and/or triplet excitons occurs under the emission of light. The subsequent radiant recombination of excitons causes the emission of light. At least one of the electrodes must be transparent enabling the light to leave the component. Typically, a transparent electrode consists of conductive oxides designated as TCOs (transparent conductive oxides), or a very thin metal electrode, however other materials can be used. The starting point in the manufacture of an organic light emitting device is a substrate on which the individual layers of the OLED are deposited. If the electrode nearest to the substrate is transparent, the component is designated as a "bottom-emitting OLED" and if the other electrode is transparent the component is designated as a "top-emitting OLED". The bottom electrode is closer to the substrate than the top electrode. The bottom electrode is formed (deposited) before the formation (deposition) of the top electrode.

The most reliable and efficient OLEDs are those comprising doped layers. By electrically doping hole transport layers with a suitable acceptor material (p-doping) or electron transport layers with a donor material (n-doping), respectively, the density of charge carriers in organic solids (and therefore the conductivity) can be increased substantially. Additionally, analogous to the experience with inorganic semiconductors, applications can be anticipated which are precisely based on the use of p- and n-doped layers in a component and otherwise would be not conceivable. The use of doped charge-carrier transport layers (p-doping of the hole transport layer by admixture of acceptor-like molecules, n-doping of the electron transport layer by admixture of donor-like molecules) in organic light-emitting diodes is described in the documents US 2008/203406 and U.S. Pat. No. 5,093,698.

The materials used in the arrangement of layers are conventional materials used in OLEDs which materials or mixtures thereof satisfy the functions of the layers such as injection layers, transport layers, emitting layers, connecting units, etc. For examples of such layers and materials, refer to the documents US 2009/045728, US 2009/0009072, EP 1 336 208, and references therein.

A light emitting region is a region made of one or more layers where the excitons which take part in light emission are formed and/or in which the excitons recombine emitting light. Possible light emitting layers are described, for example, in the documents EP 1 508 176, US 2008/203406, EP 1 705 727, U.S. Pat. No. 6,693,296. Different possible arrangements of light emitting layers in an OLED are described e.g in EP 1 804 308, EP 1 804 309. In specific cases, the charge carrier injection and the charge carrier transport, are highly balanced and an OLED can be made with a single layer EP 1 713 136, in such a case, the light emitting layer does not need to have a sharp interface, the region comprising excitons which take part in the light emission is the light emitting layer.

With respect to the organic light emitting devices, a hole transport layer (HTL) is a layer comprising a large gap semiconductor responsible to transport holes from the anode or holes from a connecting unit (CU) to the light emitting layer (LEL or EML). The HTL is comprised between the anode and the LEL or between the hole generating side of a CU and the LEL. The HTL can be mixed with another material, for example a p-dopant, in which case it is said the HTL is p-doped. The HTL can be comprised by several layers, which can have different compositions. P-doping the HTL lowers its resistivity and avoids the respective power loss due to the otherwise high resistivity of the undoped semiconductor. The doped HTL can also be used as optical spacer, because it can be made very thick, up to 1000 nm or more without significant increase in resistivity.

With respect to the organic light emitting devices, an electron transport layer (ETL) is a layer comprising a large gap semiconductor responsible to transport electrons from the cathode or electrons from a connecting unit to the light emitting layer. The ETL is comprised between the anode and the LEL or between the electron generating side of a connecting unit and the LEL. The ETL can be mixed with another material, for example an n-dopant, in which case it is said the ETL is n-doped. The ETL can be comprised by several layers, which can have different compositions. N-doping the ETL lowers its resistivity and avoids the respective power loss due to the otherwise high resistivity of the undoped semiconductor. The doped ETL can also be used as optical spacer, because it can be made very thick, up to 1000 nm or more without significant increase in resistivity.

Other layers as typically employed in OLED fabrication can be used as well, such as hole and electron blocking layers, injection layers, exciton blocking layers, etc.

The most reliable and at the same time efficient devices are organic light emitting devices comprising electrically doped layers. By electrically doping hole transport layers with a suitable acceptor material (p-doping) or electron transport layers with a donor material (n-doping), respectively, the density of charge carriers in organic solids (and therefore the conductivity) can be increased substantially. Additionally, analogous to the experience with inorganic semiconductors, some applications can be anticipated which are precisely based on the use of p- and n-doped layers in a component and otherwise would be not conceivable. The use of doped charge-carrier transport layers (p-doping of the hole transport layer by admixture of acceptor-like molecules, n-doping of the electron transport layer by admixture of donor-like molecules) in organic light-emitting diodes is, e.g., described in US 2008/203406 and U.S. Pat. No. 5,093,698.

The electrical doping can also be called redox-doping or charge transfer doping. It is known that the doping increases the density of charge carriers of a semiconducting matrix towards the charge carrier density of the undoped matrix.

US 2008/227979 discloses in detail the doping of organic transport materials, with inorganic and with organic dopants. Basically, an effective electronic transfer occurs from the dopant to the matrix increasing the Fermi level of the matrix. For an efficient transfer in a p-doping case, the LUMO energy level of the dopant is preferably more negative than the HOMO energy level of the matrix or at least slightly more positive, not more than 0.5 eV, to the HOMO energy level of the matrix. For the n-doping case, the HOMO energy level of the dopant is preferably more positive than the LUMO energy level of the matrix or at least slightly more negative, not lower than 0.5 eV, to the LUMO energy level of the matrix. It is further more desired that the energy level difference for energy transfer from dopant to matrix is smaller than +0.3 eV.

Typical examples of doped hole transport materials are: copper phthalocyanine (CuPc), which HOMO level is approximately −5.2 eV, doped with tetrafluorotetracyanoquinonedimethane (F4TCNQ), which LUMO level is about −5.2 eV; zinc phthalocyanine (ZnPc) (HOMO=−5.2 eV) doped with F4TCNQ; a-NPD (N,N'-Bis(naphthalen-1-yl)-N,N'-bis(phenyl)-benzidine) doped with F4TCNQ. a-NPD doped with 2,2'-(perfluoronaphthalene-2,6-diylidene)dimalononitrile (PD1). a-NPD doped with 2,2',2"-(cyclopropane-1,2,3-triylidene)tris(2-(p-cyanotetrafluorophenyl)acetonitrile) (PD2). All p-doping in the device examples were done with 5 mol. % of PD2. Other useful hole-transporting materials like N4,N4,N4",N4"-tetra([1,1'-biphenyl]-4-yl)-[1,1':4',1"-terphenyl]-4,4"-diamine (HT1) are disclosed in WO2011/134458. Another hole-transporting material is 2,2',7,7'-tetrakis(N,N-di-p-methylphenylamino)-9,9'-spirobifluorene (HT2). A further hole transport material is N4,N4"-di(naphtalen-1-yl)-N4,N4"-diphenyl-[1,1':4',1"-terphenyl]-4,4"-diamine (HT3) which is published in US2012/223296.

Typical examples of doped electron transport materials are: fullerene C60 doped with acridine orange base (AOB); perylene-3,4,9,10-tetracarboxylic-3,4,9,10-di-anhydride (PTCDA) doped with leuco crystal violet; 2,9-di(phenanthren-9-yl)-4,7-diphenyl-1,10-phenanthroline doped with tetrakis(1,3,4,6,7,8-hexahydro-2H-pyrimido[1,2-a]pyrimidinato)-ditungsten (II) (W2(hpp)4, ND1); naphthalene tetracarboxylic acid di-anhydride (NTCDA) doped with 3,6-bis-(dimethyl amino)-acridine; NTCDA doped with bis (ethylene-dithio)tetrathiafulvalene (BEDT-TTF). Useful air-stable precursors for n-dopants like 4,4',5,5'-tetracyclohexyl-1,1',2,2',3,3'-hexamethyl-2,2',3,3'-tetrahydro-1H,1'H-2,2'-biimidazole (ND2) are disclosed in EP 1 837 926. Another material is 2,4,7,9-1,10-phenanthroline (ET5) which is commercially available.

The organic light emitting device may comprise an external outcoupling layer outside of the electronically active region (the region between the electrodes). This external outcoupling layer is in addition to the scattering layer as described. For a top-emitting OLED, this external outcoupling can be a layer matching the refractive index of the stack to improve outcoupling from a transparent top electrode into the air. Top emitting OLEDs are describes in e.g. WO 2005/106987, EP 1 739 765. In one preferred embodiment, the scattering layer is in direct contact with the top electrode. The external outcoupling layer can also be comprised of microspheres on the bottom side of a substrate from a bottom emitting OLED.

The organic light emitting device may be formed as a non-inverted structure or as an inverted structure. In the case of the non-inverted structure, the bottom electrode is the anode and the top electrode is the cathode. In the inverted structure, the bottom electrode is the cathode and the top electrode is the anode.

The roughening layer may be formed uniformly from a material having a single molecular structure.

The organic light emitting device may be a large area illumination device wherein the roughening layer is patterned which pattern can be resolved by a human eye. For example, the pattern has dimensions which are resolved by the human eye of a human observer looking at the device at a distance of a meter to a few meters. The pattern has the advantages to be seen as a faint sign in the off state, for instance due to the different specular/diffuse surface of the reflective layer. Further, the sign can be made to be seen also in on-state, when device is set to a moderate level of brightness, the contrast between the areas of stronger and weaker outcoupling can be perceived by a human observer.

A standard value which is known from the resolution of the human eye is 1 angular minute=1/60 degree. Given a viewing distance of 1 m from the light emitter layers, this corresponds to 0.29 mm. If a viewing distance of 30 cm is assumed, a resolution of 35 approximately 100 µm results. Consequently, a value of approximately 100 µm for the lateral distance and/or the width of strip-type light emitter layers can be assumed as an expedient lower limit for lateral dimensions of the light emitter layers that can still be resolved by the human eye.

The production process for the roughening layer is adjusted to obtain the favorable growth mode: Deposition rate, substrate temperature during deposition, waiting time after film deposition (tempering). Low evaporation rates may result in a small density of the particles. On the other hand, if the evaporation rate is too high, the particles may merge together or the layer can even become amorphous. In the process of generating the roughening layer the evaporation rate of the material may be in the range of about 1 to about 10 Å/s.

The LUMO of the roughening layer differs by more than 0.5 eV from the LUMO of at least one of the neighbouring layers. It is preferred that the roughening layer is formed undoped. If the material of the roughening organic layer is an HTL (is used as an HTL), it is then preferred that the HOMO differs by more than 0.5 eV from the HOMO of the neighbouring layers. It is preferred that the roughening layer is formed undoped.

The material of the roughening layer may be, for any practical purposes in the device, an insulator.

Consequently, preferred variants have the following layer structure:
undoped roughening layer/n-doped ETL/cathode
undoped roughening layer/p-doped HTL/anode.

The roughening layer is preferably formed from molecules whose chemical structure is linear and not branched, examples are condensed ring system having less than 7 rings, such as anthracene, phenanthrene, pentacene, BPphen. A material whose chemical structure allows at least one axial rotation along a principal axis can also be used.

In the case where the roughening organic layer also forms an electron transport layer (ETL) (between cathode and organic light-emitting layer), it is possible to use materials from the class of bridged bisoxazoles (and higher homologues thereof) in particular 1,4-di(benzo[d]oxazol-2-yl)benzene.

The following materials may be excluded if used, among other properties, as electron transport material or in an electron transporting region/layer: materials from the class of bridged bisoxazoles (and higher homologues thereof) in particular 1,4-di(benzo[d]oxazol-2-yl)benzene.

The benzanelated oxathiines may be excluded, among other properties, as hole transport material or in a hole transporting region/layer. In an embodiment, the following compounds may be excluded, among other properties, as hole transport material or in a hole transporting region/layer:

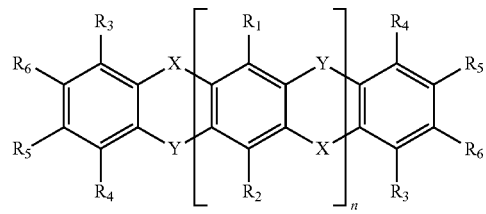

Formula A

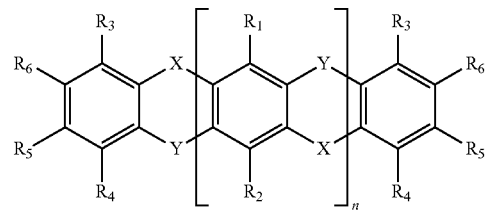

Formula B

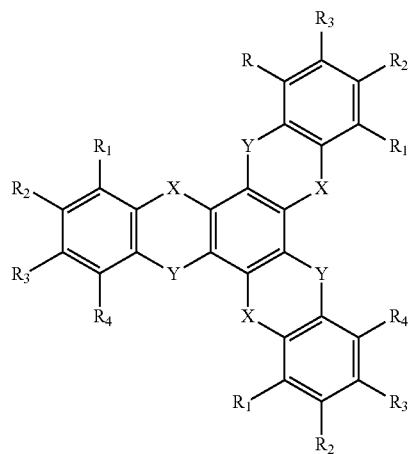

Formula C

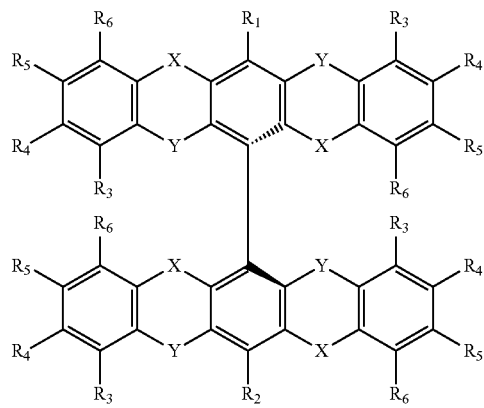

Formula D

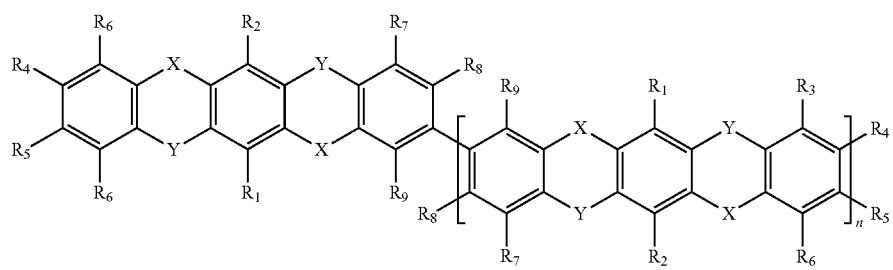

Formula E wherein X and Y are different from each other, but are otherwise independently selected from oxygen, sulphur, selenium and tellurium; n is 1, 2, 3, 4, 5 or 6; and R1-9 are independently selected from hydrogen, alkyl, aryl, heteroaryl, fused carbocycle; fused heterocycle, OR', SR' and NR2', wherein R' is independently selected from alkyl, aryl, heteroaryl, fused carbocycle and fused heterocycle.

The layer beneath the roughening layer may not comprises 2,7,9-triphenyl-4-(p-tolyl)pyrido[3,2-h]quinazoline.

BRIEF DESCRIPTION OF THE DRAWINGS

The invention is explained in detail hereinafter by means of further embodiments with reference to figures of a drawing. In the figures show:

FIG. 1 shows a schematic (cross section) representation of a layered structure of an organic light emitting device. The organic light emitting device may provide for an organic light emitting diode (OLED). The layered structure comprises a substrate 1, a bottom electrode 2, an electronically active region 10, a roughening layer 6, and a top electrode 8 covered with an encapsulation 9. There is a transport layer 7 between the top electrode 8 and the roughening layer 6. In other embodiments the transport layer 7 may not be present. The layered structure in FIG. 1 also comprises a light emitting layer 5, and a transport layer 4. In other embodiments the transport layer 4 may not be present. In addition, there an additional light emitting layer 3 which may be made of one or more layers and which may not be present in other embodiments. Different from the schematic representation in FIG. 1, there may a further transport layer between the light emitting layer 5 and the roughening layer 6.

The layer 42 may be a transport layer optionally doped or an electrode.

Figure 1:
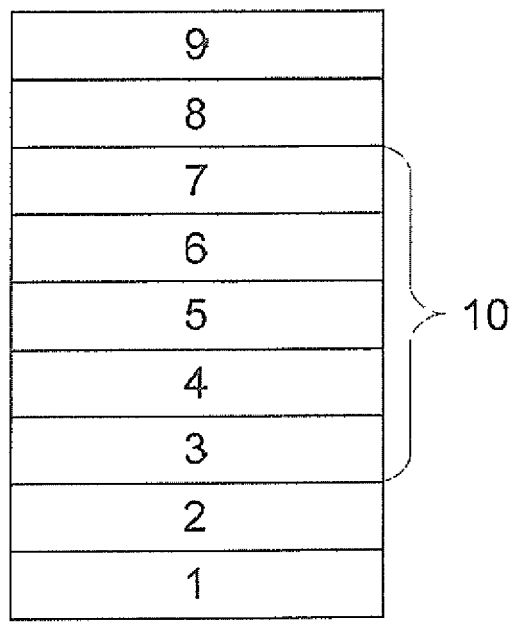
FIG. 1 a schematic (cross section) representation of a layered structure of an organic light emitting device, FIG. 2 a schematic (cross section) representation of a layer structure with a roughening layer on an underlying layer, FIG. 3 a schematic (cross section) representation of a layer structure with a roughening layer on an underlying layer, FIG. 4 a schematic (cross section) representation of an underlying layer followed by a roughening layer, and a roughened layer deposited on top of the roughening layer, FIG. 5 a schematic (cross-section) representation of a layered structure an organic light emitting device, FIG. 6 a profile measurement made with an AFM ("Atomic Force Microscopy") for a sample layer structure, FIG. 7 a layered structure for an organic light emitting device, FIG. 8 experimental results taken by SEM ("Scanning Electron Microscopy") for an organic light emitting device, FIG. 9 experimental results taken by SEM for an organic light emitting device, FIG. 10 experimental results taken by SEM for an organic light emitting device, FIG. 11 experimental results taken by SEM for an organic light emitting device, FIG. 12 experimental results taken by SEM for an organic light emitting device, FIG. 13 a layered structure for an organic light emitting device, FIG. 14 experimental results for organic light emitting devices prepared with the layer structure in FIG. 13 taken by SEM, FIG. 15 experimental results for organic light emitting devices prepared with the layer structure in FIG. 13 taken by SEM, FIG. 16 experimental results taken by AFM for layered structures, FIG. 17a layered structure for an organic light emitting device, FIG. 18a layered structure for an organic light emitting device, and FIG. 19 experimental results taken by SEM for an organic light emitting device.
Figure 2:
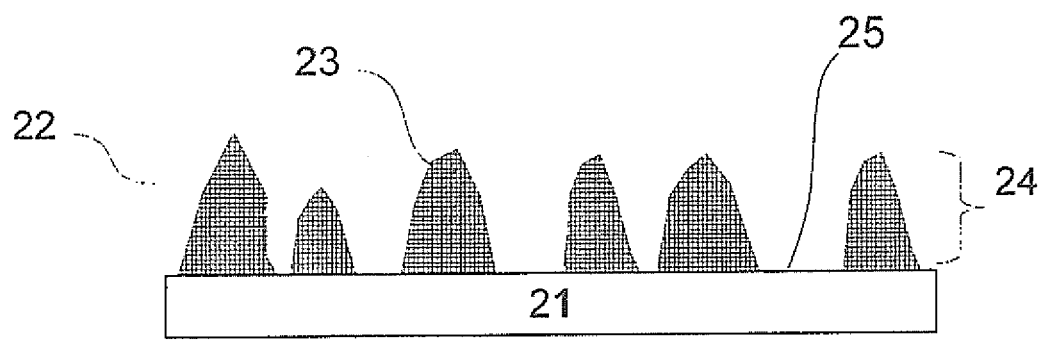
FIG. 2 shows a schematic (cross section) representation of a layer structure with a roughening layer 22 on an underlying layer 21. The roughening layer 22 is provided a non-closed layer. Particles 23 of the roughening layer 22 are separated from each other providing an island or particle structure. The particles 23 have a height 24. There open spaces or regions 25 located between adjacent particles. In the open spaces 25 the material of the roughening layer 22 does not cover the underlying layer 21. Such layer design, for example, may be generated by a Volmer-Weber (VW) mode growth of the roughening layer 22 on the underlying layer 21.
Figure 3:
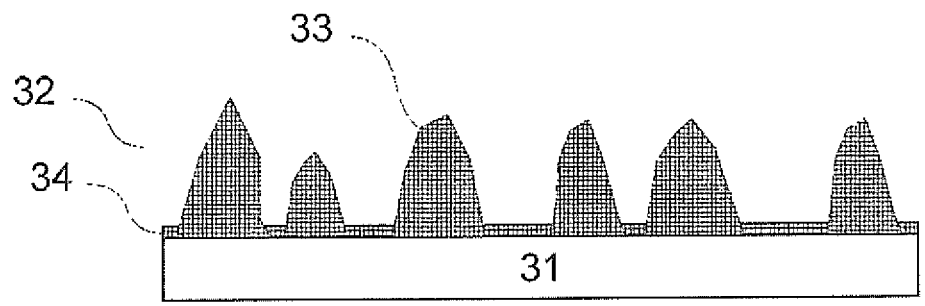
FIG. 3 shows a schematic (cross section) representation of a layer structure with a roughening layer 32 provided with roughening structures, namely particles 33, on an underlying layer 31. There is a ground layer 34 being made of the same material as the particles 33, having a thickness of 5 nm or less and covering the underlying layer 31 in regions between the particles 33 providing the roughening structures. Together the particles 33 and the ground layer 34 provide an iceberg structure for the roughening layer. Such layer structure, for example, may be provided by a Stranski-Krastanow (SK) mode growth of the roughening layer 32 on the underlying layer 31.
Figure 4:
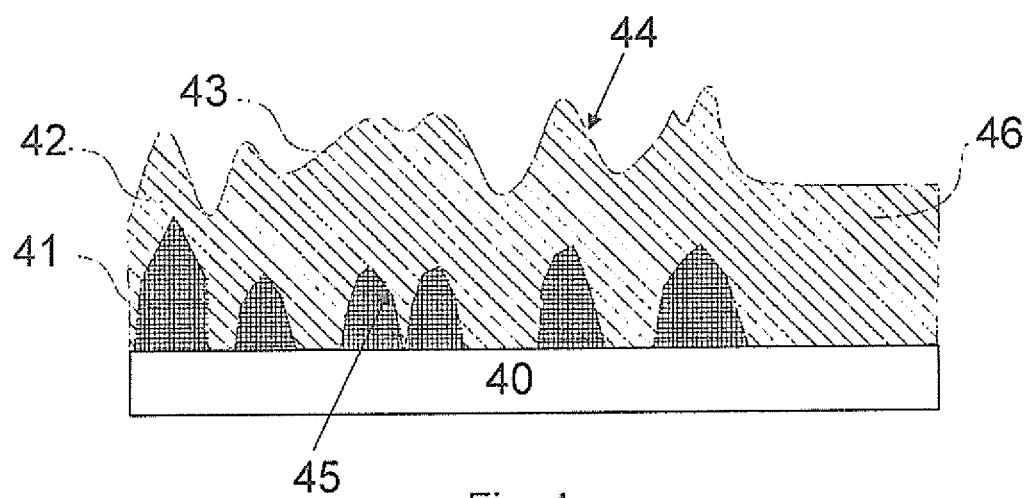
FIG. 4 shows a schematic (cross section) representation of an underlying layer 40 followed by a roughening layer 41, and a roughened layer 42 deposited on top of the roughening layer 41. The roughened layer 42 is provided with a roughness comprising roughness structures 43 on the outer side 44 and the inner side 45. In other embodiments (not shown), the roughened layer 42 may be provided with surface roughness only on the inner side 45, while the outer side 44 is flat.

FIG. 4 also shows a region 46 without roughening structures (without particles), such region can be created, e.g. by using shadow mask during evaporation. In the region 46, the thickness of the layer 42 can be directly measured, for instance by a profilometer. Note, the figures are only schematic and not necessarily in scale.

Figure 5:
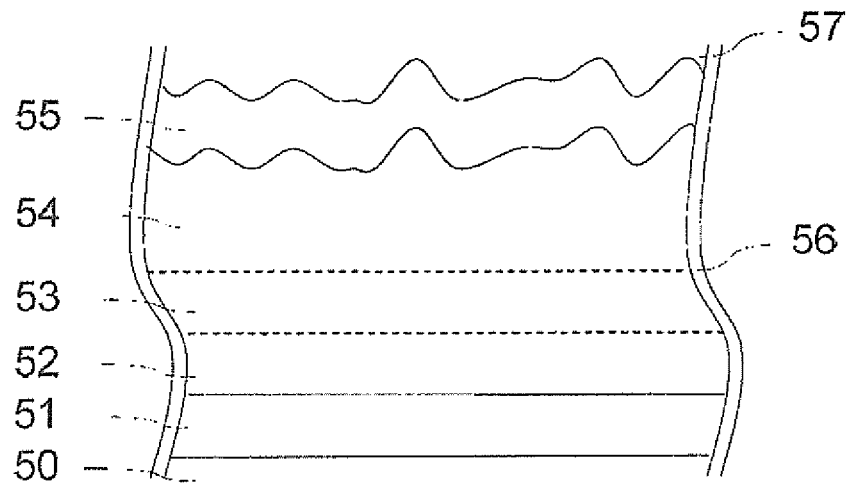

FIG. 5 shows a schematic (cross-section) representation of a layered structure an organic light emitting device. There are a substrate 50, a bottom electrode 51, for example an ITO anode, organic layers 52, 53 and 54. An organic-organic interface is marked by a dash line (e.g. 56). The organic layer 54 comprises also the roughening particles (not explicitly shown), which lead to a roughness 57 of a top electrode 55 being, for example, an Al cathode.

Figure 6:
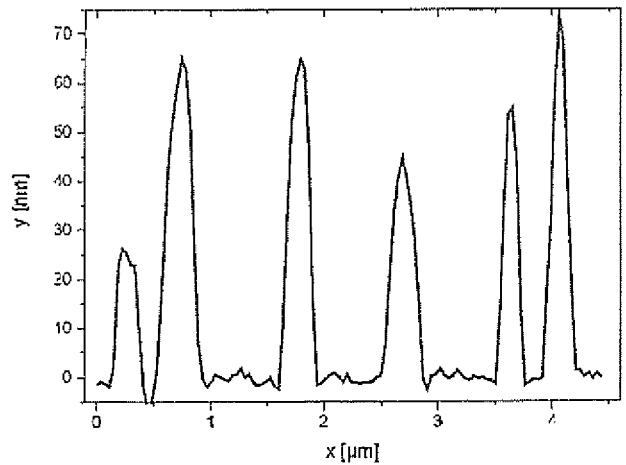

FIG. 6 shows a profile measurement made with an AFM on a sample quartz/30 nm 2,7,9-triphenyl-4-(p-tolyl)pyrido[3,2-h]quinazoline/10 nm of compound (1a—see below) 30 nm 2,7,9-triphenyl-4-(p-tolyl)pyrido[3,2-h]quinazoline/100 nm Ag. The 30 nm 2,7,9-triphenyl-4-(p-tolyl)pyrido[3,2-h]quinazoline layer on quartz was flat with roughness lower than 3 nm. The layer of compound (1a) did not form a closed layer, but only particles. This measurement is shown from the top of the Ag electrode, because this freezes the morphology of the layer of the compound (1a) (shortest waiting time).

The organic layered structures referred to above contain at least one light-emitting layer. Typical layered structures for organic light emitting diodes are described, for example, in EP 1 705 727, EP 1 804 309. The OLED can also have a p-i-n layered structure, which is described, for example, in U.S. Pat. No. 7,074,500, US 2006/250076. The n- and p-dopants used in a p-i-n OLED are described, for example, in U.S. Pat. No. 6,908,783, US 2008/265216, WO 07/107,306, EP 1 672 714.

The following compounds may be used for producing the roughening layer(s) in the organic light emitting device:

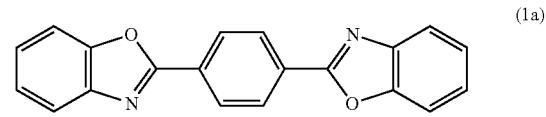

(1a)

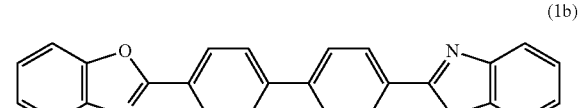

(1b)

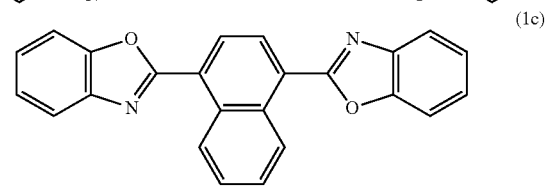

(1c)

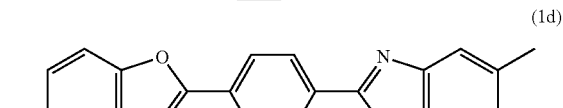

(1d)

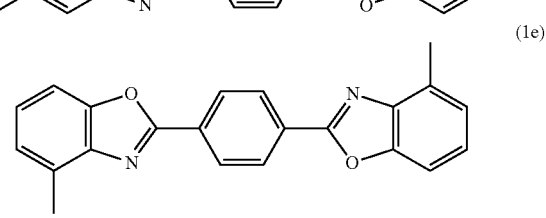

(1e)

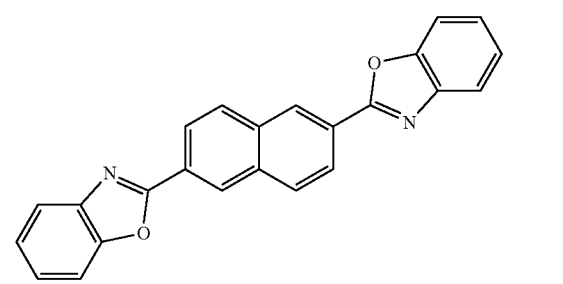

(1f)

The compounds (1a) to (1f) and their synthesis are known as such. One or more of the compounds have been used as fluorescent brighteners.

Syntheses of the compounds (4-(dibenzo[c,h]acridin-7-yl)phenyl)diphenylphosphine oxide (ET3) and 7-(4'-(1-phenyl-1H-benzo[d]imidazol-2-yl)-[1,1'-biphenyl]-4-yl)dibenzo[c,h]acridine (ET4) used for an electron transport layer were carried out as follows. THF stands for tetrahydrofuran, MTBE for methyl-tert-butylether, DCM for dichloromethane, Et2O for diethyl ether, MeOH for methanol, BuLi for butyllithium, HPLC for high performance liquid chromatography, NMR for nuclear magnetic resonance.

First step: Synthesis of (E)-2-(4-bromobenzylidene)-3,4-dihydronaphthalen-1(2H)-one (c). All manipulations were carried out in air, without any further purification of commercial solvents/chemicals.

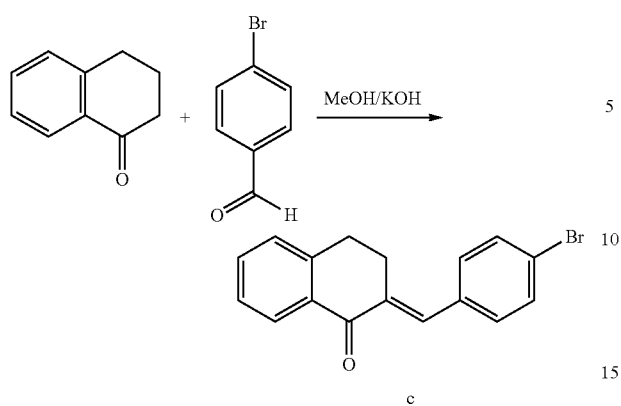

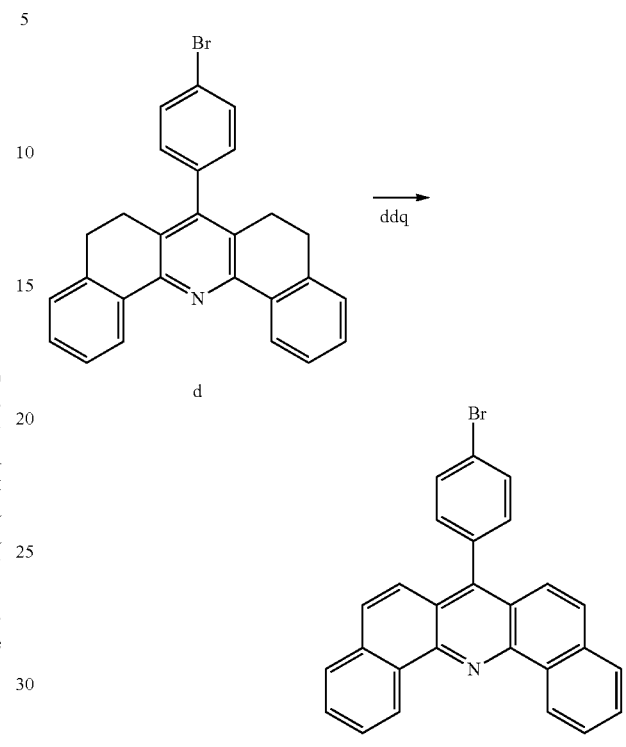

A 250 mL flask was charged with tetralone (3.22 g, 22 mmol) and 4-bromobenzaldehyde (5.3 g, 28.6 mmol). This was dissolved in warm tetrahydrofuran (12 mL), and to this yellow solution was slowly added a 4 wt % solution of KOH in methanol (100 mL). The reaction was stirred for 4 days at room temperature. The mixture was concentrated and reduced to approx 10% vol. The residue was filtered and washed with MTBE (3*50 mL), dried, to afford a light yellow powder (6.61 g, 96%).

Second step: Synthesis of 7-(4-bromophenyl)-5,6,8,9-tetrahydrodibenzo[c,h]acridine (d). Both reaction steps were carried out under argon.

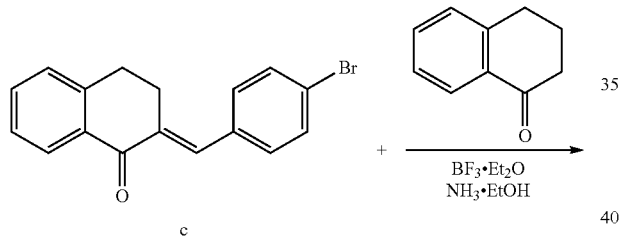

c (6.54 g, 20.9 mmol) and tetralone (2.93 g, 20.0 mmol) were introduced in a flask together with $BF_3 \cdot Et_2O$ (3 mL, 23.7 mmol). The mixture is stirred at 100° C. for 4 hours and cooled to room temperature. $Et_2O$ was added (25 mL) and the mixture is stirred for an additional hour. The precipitate is filtered and washed with $Et_2O$ (20 mL). The dried powder (3.8 g) was then introduced at 0° C. in a flask together with an ammonia-ethanol solution. The mixture was allowed to stir at room temperature for 5 h, the precipitate was filtered and washed several times with ethanol.

2.98 g (34% yield) white powder was obtained.

Third step: Synthesis of 7-(4-bromophenyl)dibenzo[c,h] acridine (7). The oxidative dehydrogenation was carried out under argon.

d (2.98 g, 6.80 mmol) was dissolved in 190 mL dioxane and 2,3-dichloro-5,6-dicyanobenzoquinone was added (10.9 g, 48 mmol). The mixture was refluxed under argon for 2 days. The reaction mixture was then cooled to room temperature, poured in 600 mL saturated aqueous sodium carbonate solution and stirred at 65° C. for 30 min. The mixture was then cooled to room temperature. The precipitation was filtered and washed with water and dichloromethane.

Yield: 2 g (68%). $^1$H NMR (500 MHz, $CD_2Cl_2$) δ (ppm): 9.80 (d, J=8.0, 2H), 8.00-7.68 (m, 10H), 7.53 (d, J=9.2, 2H), 7.45-7.34 (m, 2H).

Fourth step: Synthesis of (4-(dibenzo[c,h]acridin-7-yl) phenyl)diphenylphosphine oxide (23). Reactions with butyllithium and with diphenylphosphine chloride were carried out in dry solvents under argon.

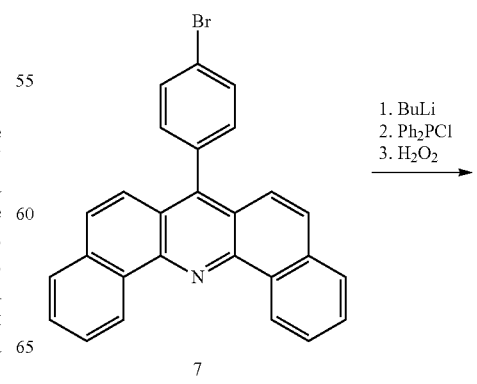

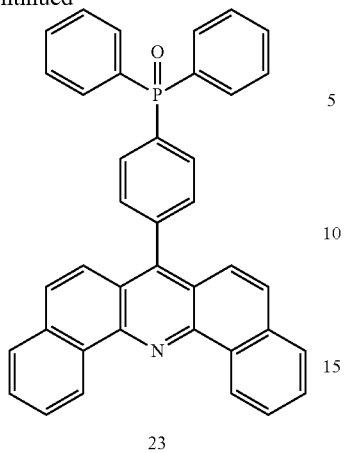

23

(7) (2.84 g, 5.11 mmol) was dissolved in 40 mL THF. The solution was cooled down to −78° C. and n-BuLi was added dropwise within 20 min (2.5 mol/L, 3.5 mL, 8.68 mmol), and then stirred at that temperature for 1 hour. The temperature is then let rise up to −50° C., and diphenylphosphine chloride (1.13 g, 5.11 mmol) was added and the mixture was stirred overnight at room temperature. The reaction was then quenched with methanol (25 mL), and the solvents were evaporated. The residue was solved in 40 mL dichloromethane and 8 mL aqueous $H_2O_2$ was then added (30% aq. solution w/w) and stirred overnight. The reaction mixture was then washed several times with 50 mL brine, the organic phase was then dried and evaporated. The crude product was purified via column chromatography ($SiO_2$, dichloromethane, then DCM/MeOH 97:3). The foamy product obtained by vacuum evaporation was then washed with 200 mL MTBE.

There is a yield of 1.6 g (43%). There was a HPLC purity of >97%.

NMR: $^{31}$P NMR (CDCl$_3$, 121.5 MHz): δ (ppm): 29 (m). $^{1}$H NMR (500 MHz, CD$_2$Cl$_2$) δ (ppm): 9.79 (d, 8.06 Hz, 2H), 7.86 (m, 10 Hz), 7.75 (m, 2 Hz), 7.69 (d, 9.20 Hz, 2H), 7.58 (m, 8 Hz), 7.44 (d, 9.18 Hz, 2H).

Fourth step: Synthesis of 7-(4'-(1-phenyl-1H-benzo[d]imidazol-2-yl)-[1,1'-biphenyl]-4-yl)dibenzo[c,h]acridine (26). The Pd-catalyzed condensation was carried out under argon.

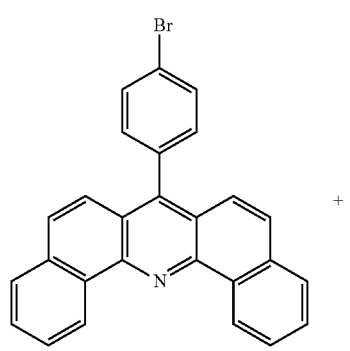

7

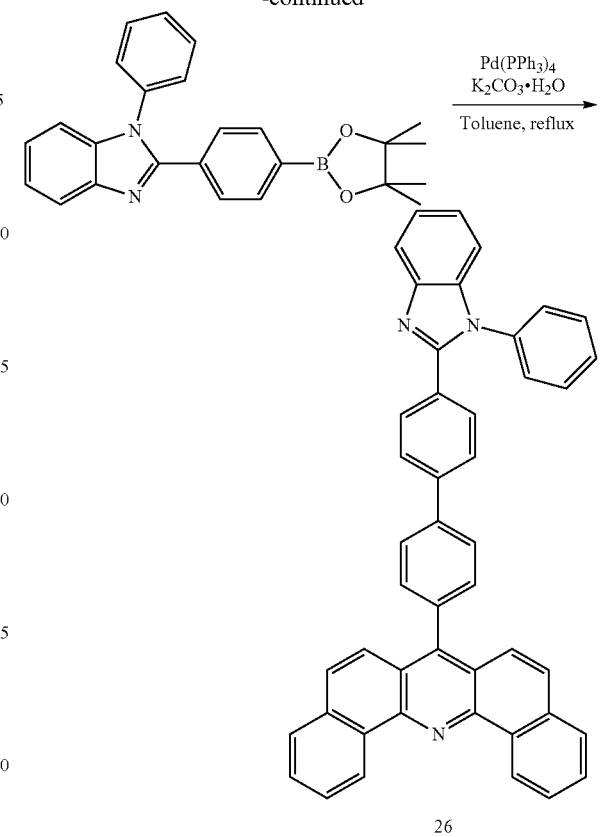

26

(7) (2.1 g, 4.8 mmol), 1-phenyl-2-(4-(4,4,5,5-tetramethyl-1,3,2-dioxaborolan-2-yl)phenyl)-1H-benzo[d]imidazole (3.8 g, 9.6 mmol), palladium tetrakis triphenylphosphine (830 mg) and 17 mL 1M potassium carbonate aqueous solution were introduced in a flask together with 35 mL degassed toluene. This mixture was stirred at 80° C. during 36 hours, cooled down to room temperature and filtered. The obtained solid was then dissolved in 600 mL DCM and filtered over a celite pad. The volatiles were removed by rotary evaporation and the solid residue was then dried overnight in a vacuum oven.

There is a yield of 1.2 g (40%). There was a HPLC purity of >98%. $^{1}$H NMR (500 MHz, CD$_2$Cl$_2$) δ (ppm): 9.82 (d, 8.16 Hz, 2H), 7.85 (d, 7.60 Hz, 2H), 7.88 (m, 5H), 7.79 (m, 2H), 7.76 (s, 4H), 7.74 (s, 1H), 7.63 (d, 9.2 Hz, 2H), 7.59 (m, 3H), 7.56 (m, 1H), 7.43 (dd, 3.13 Hz, 5.32 Hz, 2H), 7.36 (m, 1H), 7.29 (dt, 3.01 Hz, 3.01 Hz, 7.35 Hz, 2H).

The synthesis of compounds 2,7,9-triphenyl-4-(p-tolyl)pyrido[3,2-h]quinazoline (ET1) and 4-(naphtalen-1-yl)-2,7,9-triphenylpyrido-[3,2-h]quinazoline (ET2) is described in the document EP 1 970 371.

The following layer sequences are examples of how to generate the desired morphology. The layer sequences were included into an organic light emitting diode. In each pair of layers, the layer made of a first material provides the underlying layer (ETL or n-ETL), and the following layer made of a second material provides for the roughening layer. The structure in the device stack is as follows: EML/underlying layer/roughening layer.

Best results were achieved by inserting the layer sequences in an OLED stack with electrically doped layers. All deposition was done at room temperature. Materials used in emitting layer, commercially available from Sun Chemicals, are represented by their trade codes ABH036, NRD129 and NUBD369.

| pair | Material | Nominal thickness | Density used for QCM | Rate of deposition |
|---|---|---|---|---|
| 1 | ET1 | 10 nm | 1.2 g/cm$^3$ | 1 Å/s |
|   | compound (1b) | 10 nm | 1.3 g/cm$^3$ | 6 Å/s |
| 2 | ET1 | 10 nm | 1.2 g/cm$^3$ | 1 Å/s |
|   | compound (1c) | 10 nm | 1.3 g/cm$^3$ | 6 Å/s |
| 3 | ET1 doped with W$_2$(hpp)$_4$ (ND1) | 10 nm | 1.2 g/cm$^3$ | 1 Å/s |
|   | compound (1a) | 10 nm | 1.3 g/cm$^3$ | 6 Å/s |
| 4 | ET1 | 10 nm | 1.2 g/cm$^3$ | 1 Å/s |
|   | compound (1a) | 10 nm | 1.3 g/cm$^3$ | 5 Å/s |
| 5 | ET1 | 10 nm | 1.2 g/cm$^3$ | 0.8 Å/s |
|   | compound (1a) | 10 nm | 1.3 g/cm3 | 6 Å/s |
| 6 | ET3 | 30 nm | 1.3 g/cm3 | 1 Å/s |
|   | compound (1a) | 10 nm | 1.3 g/cm3 | 6 Å/s |
| 7 | ET4 | 30 nm | 1.3 g/cm3 | 1 Å/s |
|   | compound (1a) | 10 nm | 1.3 g/cm3 | 6 Å/s |

Contrary to most of techniques to improve light outcoupling, in which the adding different means do not provide an additive effect on the performance of the OLED, in the present invention, it was surprisingly found that the OLEDs can be further considerably improved.

By adding an external outcoupling foil comprising a micro lense array to improve the extraction of the light, it was possible to almost double the efficiency of the best OLEDs by a factor of almost 2, obtaining a power efficiency of above 60 lm/W.

Figure 7:
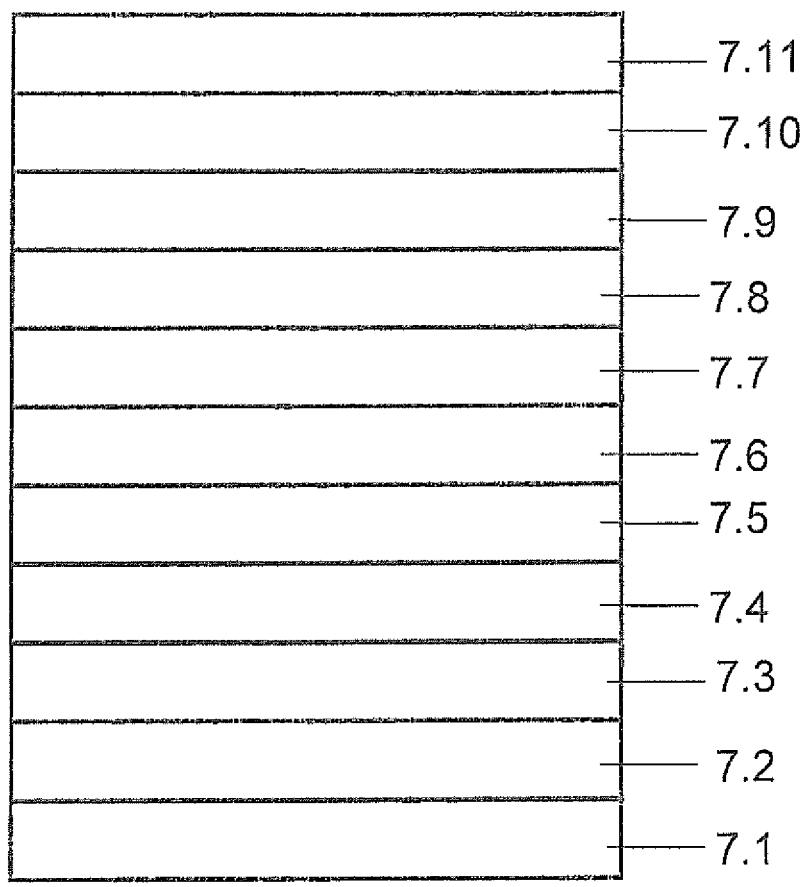

An organic light emitting device was prepared as shown in FIG. 7. The following layered structure was prepared:

7.1: Glass substrate
7.2: ITO
7.3: HT1:PD2 (97:3) (layer thickness: 30 nm)
7.4: HT1: PD2 (99:1) (145 nm)
7.5: HT1 (10 nm)
7.6: ABH036:NRD129 (99:1) (5 nm)
7.7: ABH036:NUBD369 (95:5) (25 nm)
7.8: ET2 (10 nm)
7.9: compounds (1d)-(1f)
7.10: ET2:ND2 (90:10) (30 nm)
7.11: Ag (100 nm)

For reference, an organic light emitting device was prepared without layer 7.9.

With respect to the devices comprising layer 7.9, the following materials were used: compound (1d), compound (1e) and compound (1f).

Following reference is made to FIGS. 8 to 12.

Organic light emitting devices prepared with a layered structure as indicated in FIG. 7 were prepared and investigated. FIGS. 8 to 12 show experimental results taken by SEM ("Scanning Electron Microscopy"), the cut has been prepared by focused ion beam (FIB) for the different devices.

In FIGS. 8 to 12, the top drawing shows a cross section for the device, while the bottom drawing shows a top view of the top electrode of the device. For the cross section images the following parameters are used: magnification: 100 000×, EHT (electron high tension): 1 kV, working distance (WD): 5.1-5.2 mm, aperture size: 30 μm, and detector: in-lens, or SESI (Combined Secondary Electron Secondary Ion) (only in FIG. 12a). With respect to the top view of electrode surface, the following parameters were used: magnification: 50 000×, EHT (electron high tension): 3 kV, working distance (WD): 4.9-5.1 mm, aperture size: 30 μm, and detector: SESI, or SE2 (only in FIG. 15b).

Figure 8A:
Figure 8B:
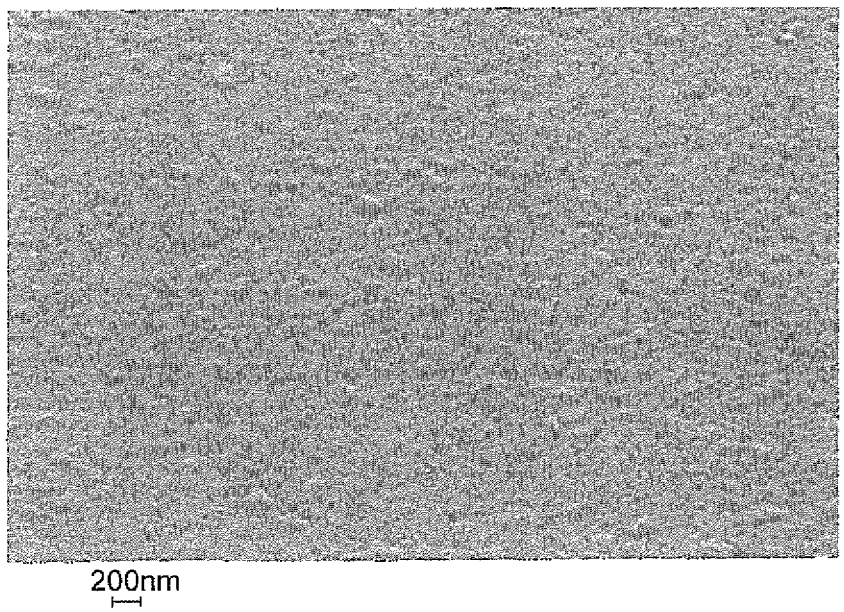

With respect to FIG. 8, layer 7.9 was prepared from material (A) with a layer thickness of 6.7 nm (deposition rate 3 Å/s). With respect to FIG. 9, layer 7.9 was prepared from material (B) with a layer thickness of 6.1 nm (deposition rate 3 Å/s). With respect to FIG. 10, layer 7.9 was prepared from material (A) with a nominal layer thickness of 10.1 nm (deposition rate 1 Å/s). With respect to FIG. 11, layer 7.9 was prepared from material (B) with a nominal layer thickness of 10.1 nm (deposition rate 1 Å/s). With respect to FIG. 12, layer 7.9 was prepared from material (C) with a nominal layer thickness of 5.6 nm (deposition rate 3 Å/s).

Following, experimental results for the devices shown in FIGS. 8 to 12 are summarized.

Figure 9A:
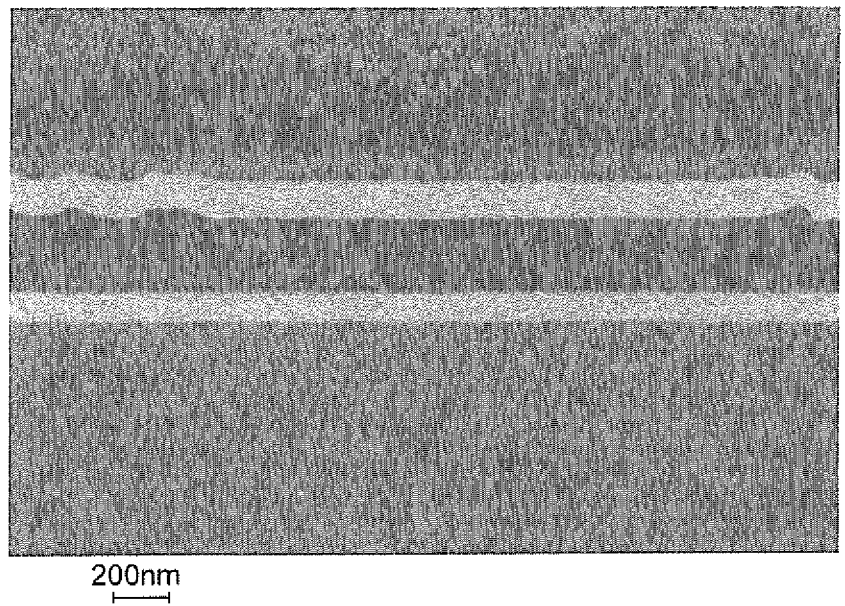
Figure 9B:
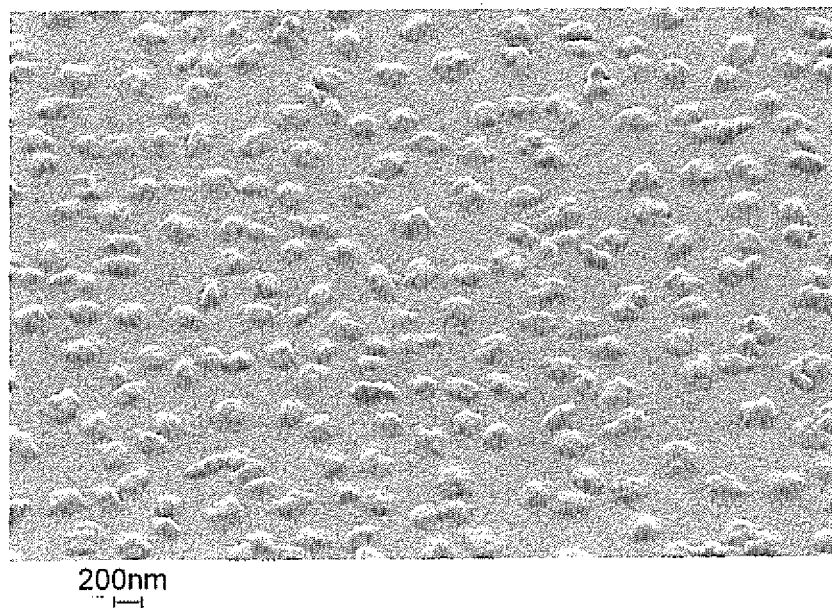
Figure 10A:
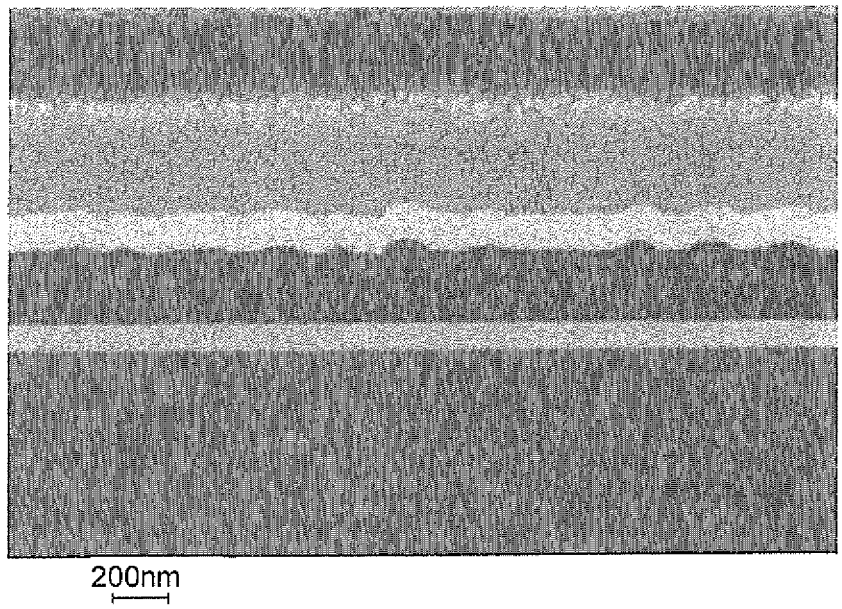
Figure 10B:
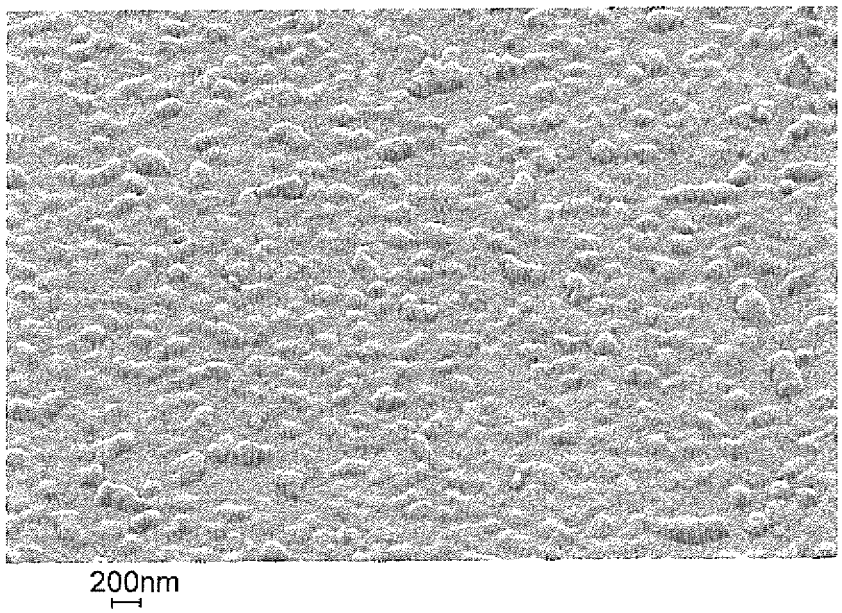
Figure 11A:
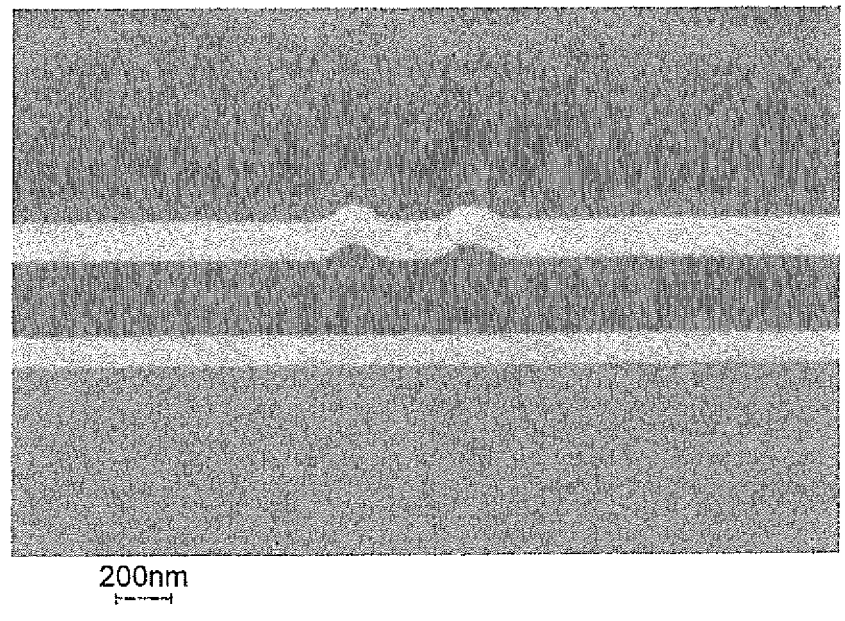
Figure 11B:
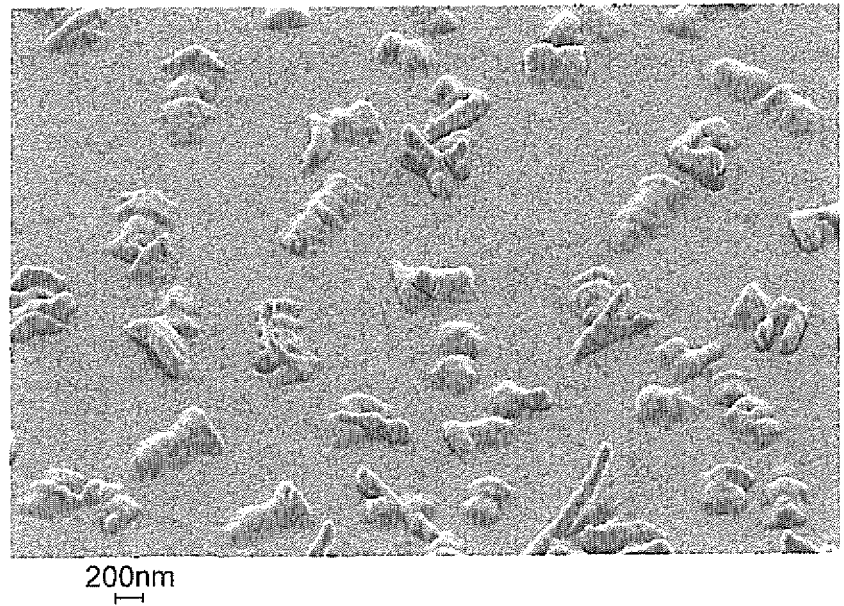
Figure 12A:
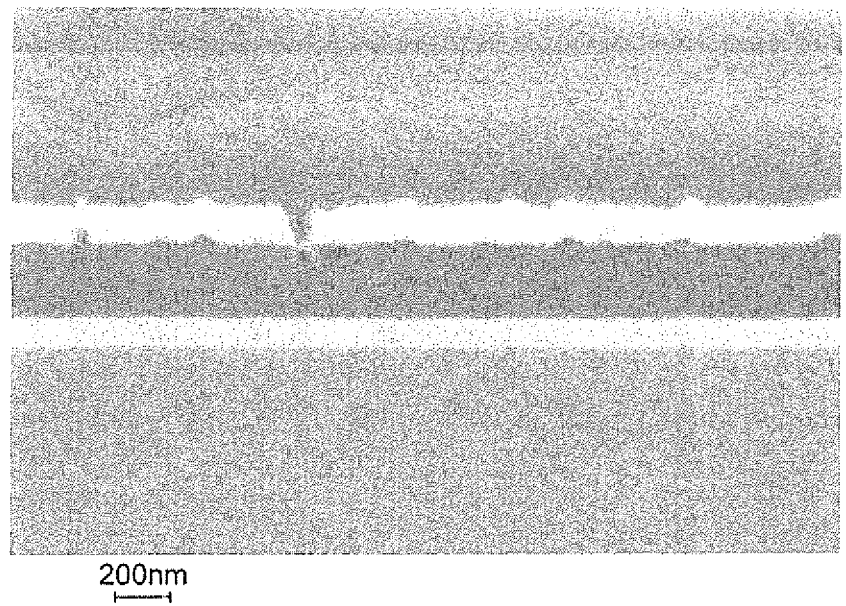
Figure 12B:
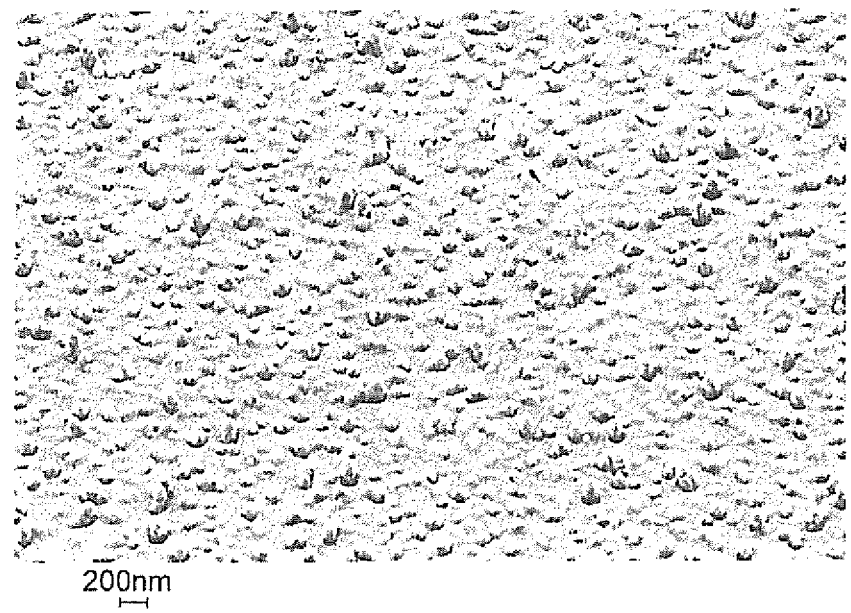

| No. | Stack | Area mm$^2$ | Current mA | Voltage V | CIEx | CIEy | PEff lm/W | % EQE | EQE-Enhancement |
|---|---|---|---|---|---|---|---|---|---|
| 1 | FIG. 8 | 6.7 | 0.38 | 3.61 | 0.439 | 0.409 | 16.32 | 7.87 | 1.06 |
|   | Reference | 6.7 | 0.38 | 3.16 | 0.455 | 0.418 | 18.00 | 7.43 |   |
| 2 | FIG. 9 | 6.7 | 0.37 | 3.13 | 0.463 | 0.417 | 20.21 | 8.47 | 1.17 |
|   | Reference | 6.7 | 0.37 | 3.12 | 0.456 | 0.417 | 18.02 | 7.25 |   |
| 3 | FIG. 10 | 6.7 | 0.38 | 3.32 | 0.443 | 0.406 | 18.23 | 8.10 | 1.18 |
|   | Reference | 6.7 | 0.38 | 3.09 | 0.461 | 0.420 | 17.19 | 6.86 |   |
| 4 | FIG. 11 | 6.7 | 0.37 | 3.11 | 0.457 | 0.410 | 20.35 | 8.70 | 1.20 |
|   | Reference | 6.7 | 0.37 | 3.08 | 0.456 | 0.416 | 17.68 | 7.25 |   |
| 5 | FIG. 12 | 6.7 | 0.67 | 3.30 | 0.459 | 0.417 | 18.53 | 7.99 | 1.06 |
|   | Reference | 6.7 | 0.67 | 3.42 | 0.455 | 0.415 | 16.82 | 7.57 |   |

Area is the active area of OLED. CIE X and CIE Y are chromaticity coordinated defined by the International Commission on Illumination (CIE) in 1931. Peff refers to power efficiency (or luminance efficiency) (measured in lm/W). EQE is external quantum efficiency. EQE enhancement is the ratio between EQE of the stack with roughening layer and EQE of the stack without roughening layer. The values have been obtained from measurements in an integrating sphere at the current specified in the table.

Figure 13:
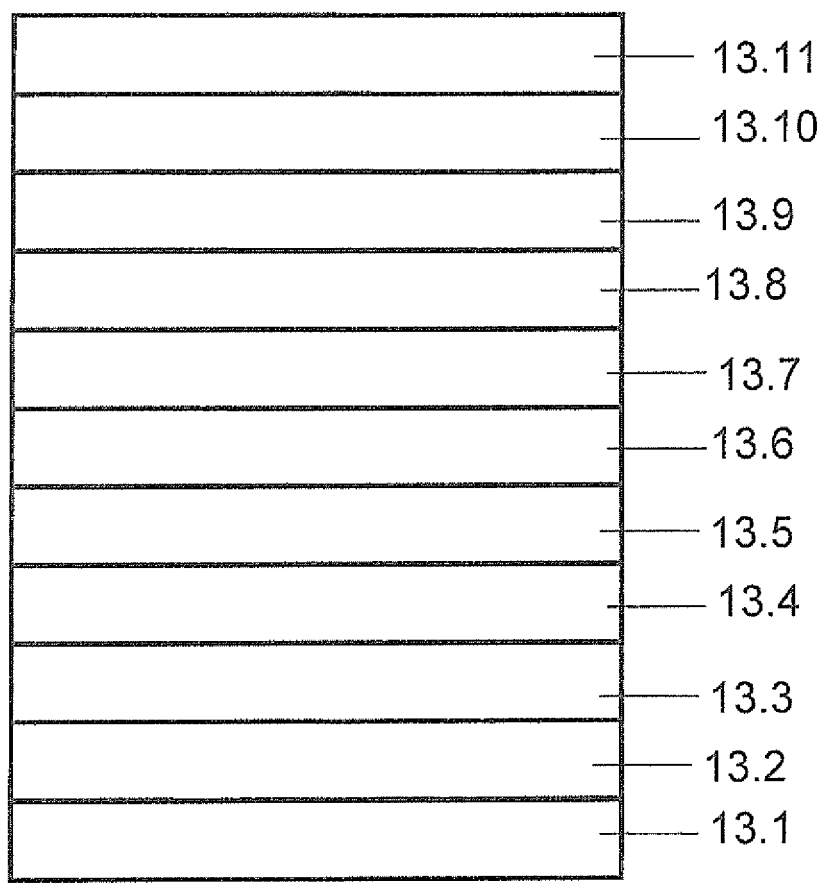

Another organic light emitting device was prepared as shown in FIG. 13. The following layered structure was prepared:

13.1: Glass substrate
13.2: ITO
13.3: HT1:PD2 (97:3) (layer thickness: 30 nm)
13.4: HT1:PD2 (99:1) (145 nm)
13.5: HT1 (10 nm)
13.6: ABH036:NRD129 (99:1) (5 nm)
13.7: ABH036:NUBD369 (95:5) (25 nm)
13.8: ET2 (10 nm)
13.9: compounds (1d)-(1f)
13.10: ET2:ND1 (30 nm)
13.11: Ag For reference, an organic light emitting device was prepared without layer 13.9.

Figure 14A:
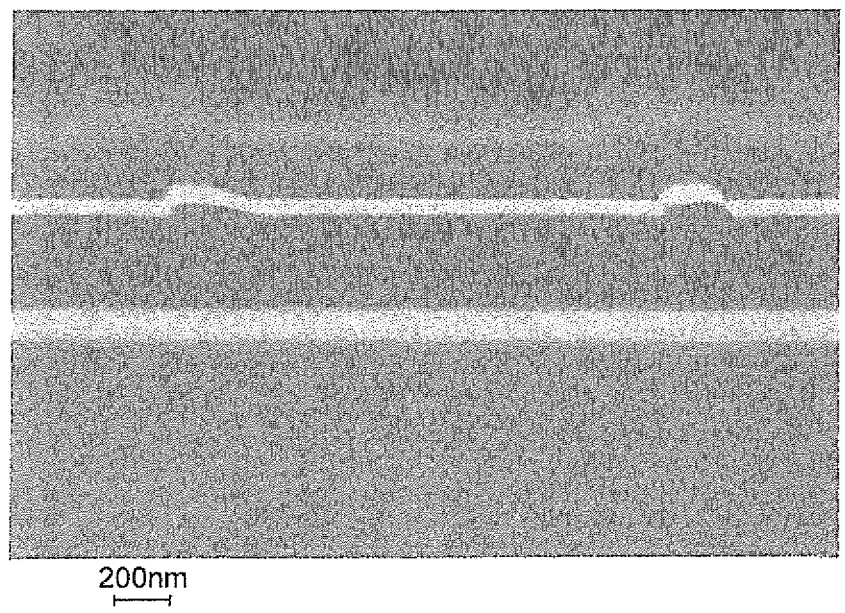
Figure 14B:
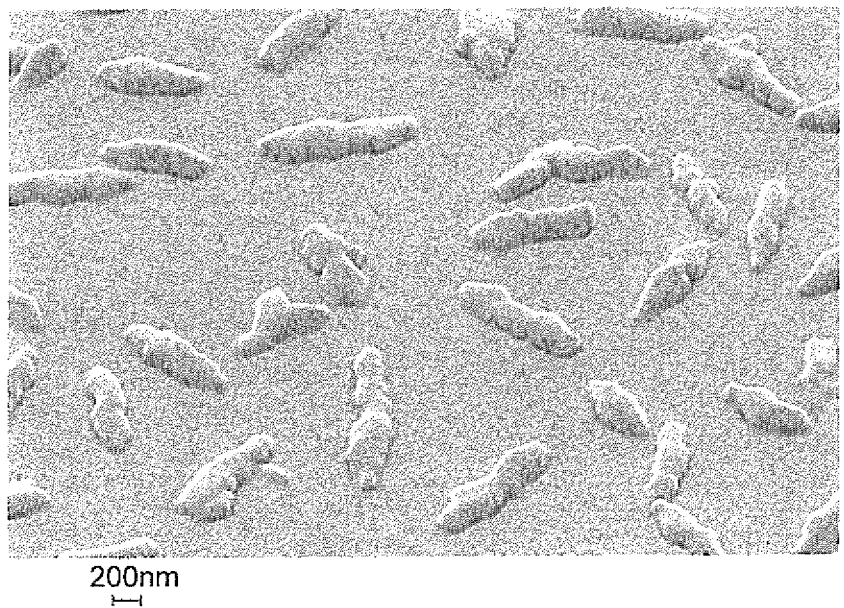
Figure 15A:
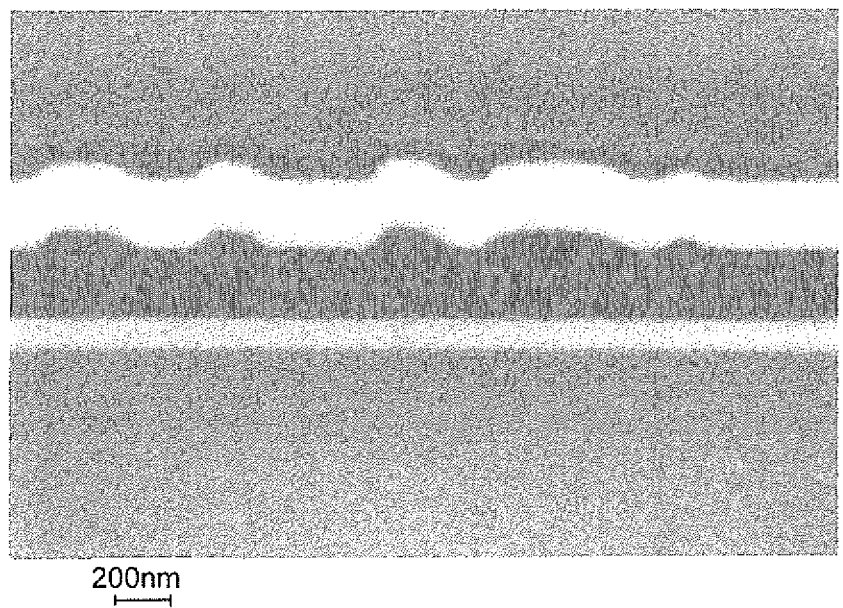
Figure 15B:
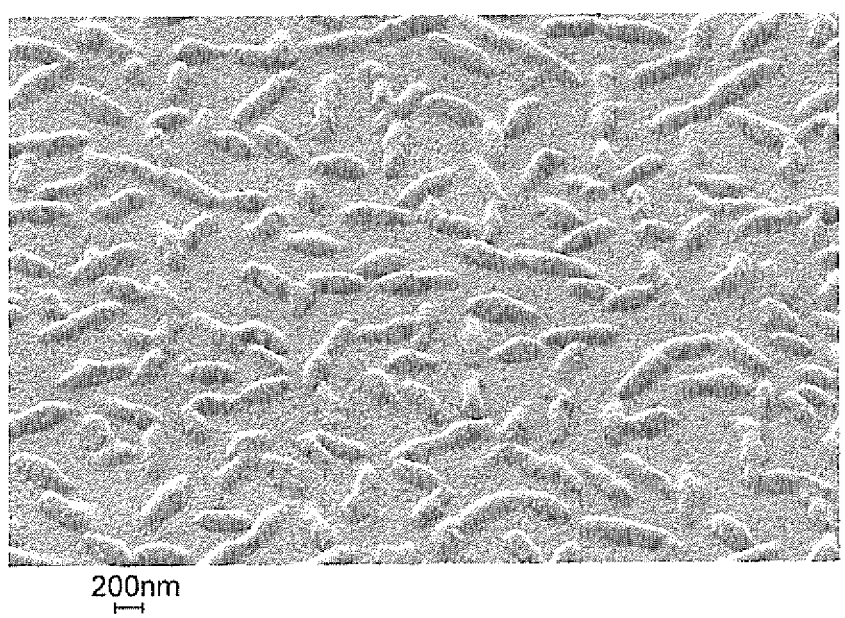

FIGS. 14 and 15 show experimental results for organic light emitting devices prepared with the layer structure in FIG. 13 taken by SEM. Again, the top drawing in FIGS. 14 and 15 shows a cross section, while the bottom drawing shows a top view of the respective device.

With respect to FIGS. 14 and 15, layer 13.9 was prepared from compound (1a). A deposition rate of 0.8 Å/s has been used in FIG. 14, and there is a deposition rate of 6 Å/s for the example in FIG. 15. It should be noted that the active areas are different, therefore, efficiency enhancement cannot be compared for this two cases because of the effect of substrate thickness. There are also some differences in the stack that do not influence morphology and efficiency enhancement: FIG. 14—ET2:ND1 (15%), 100 nm cathode, and FIG. 15—ET2:ND1 (8%); 250 nm cathode.

Following, experimental results for the devices shown in FIGS. 14 and 15 are summarized.

| No. | Stack | Area mm$^2$ | Current mA | Voltage V | CIEx | CIEy | PEff lm/W | % EQE | EQE-Enhancement |
|---|---|---|---|---|---|---|---|---|---|
| 6 | FIG. 14 | 6.7 | 0.67 | 3.22 | 0.446 | 0.411 | 20.30 | 8.67 | 1.19 |
|   | Reference | 6.7 | 0.67 | 3.18 | 0.441 | 0.412 | 17.34 | 7.30 |  |
| 7 | FIG. 15 | 442 | 15 | 3.05 | 0.44 | 0.42 | 27.9 | 11.1 | 1.49 |
|   | Reference | 442 | 15 | 3.00 | 0.43 | 0.42 | 19.0 | 7.4 |  |

FIGS. 16a to 16d show experimental results taken by AFM for layered structures wherein compound (1a) was deposited on an organic layer made of ET2.

Figure 16A:
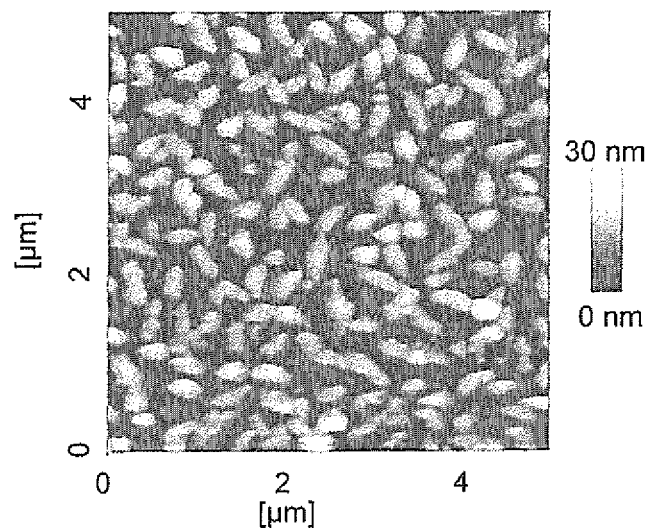
Figure 16B:
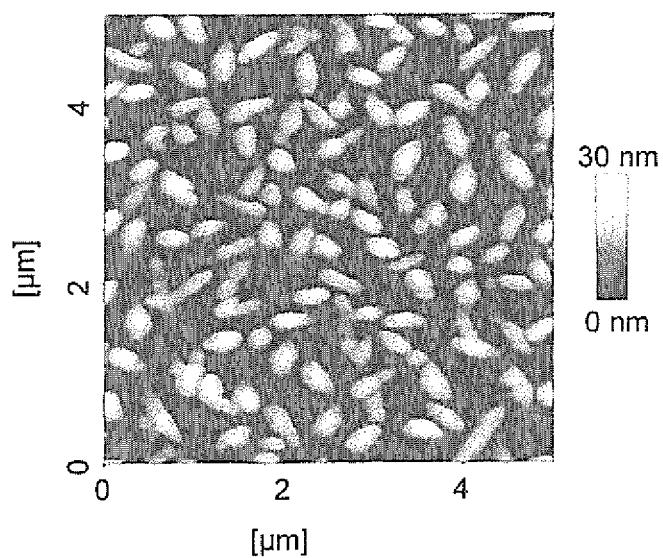
Figure 16C:
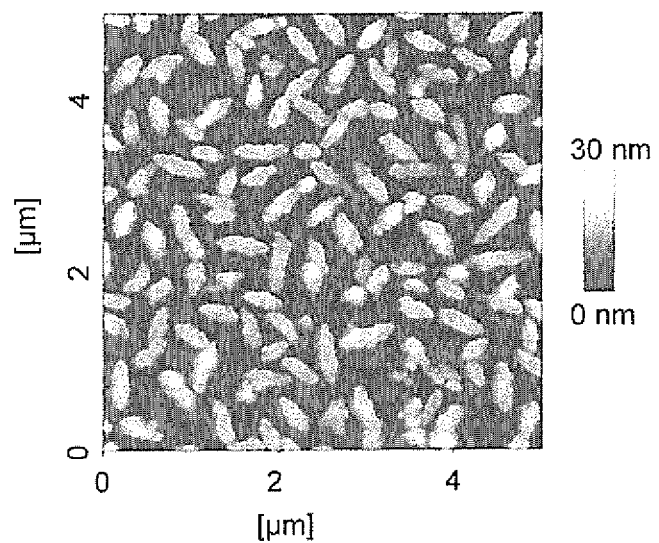
Figure 16D:
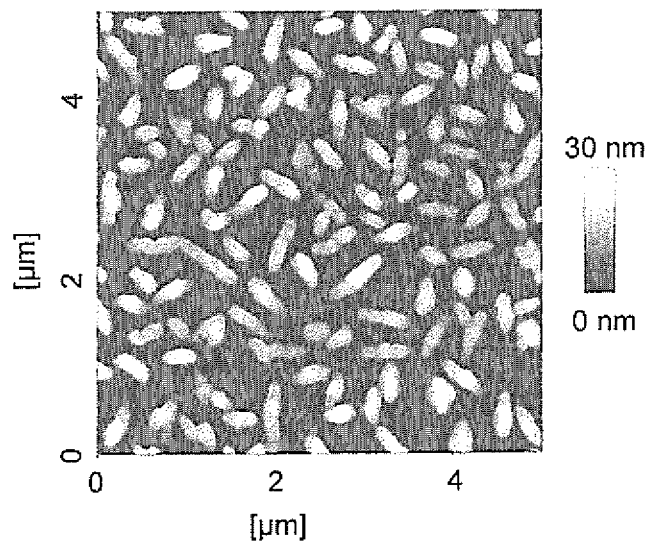

FIGS. 16a and 16c show results for a layer structure without a metal top electrode and with a metal top electrode made of an Ag layer of 100 nm. FIGS. 16b and 16d show results for a layer structure were on the roughening layer a transport layer made of ET2 with 30 nm thickness was deposited. Again, FIG. 16b and FIG. 16d show results with and without the metal top electrode made of Ag.

Figure 17:
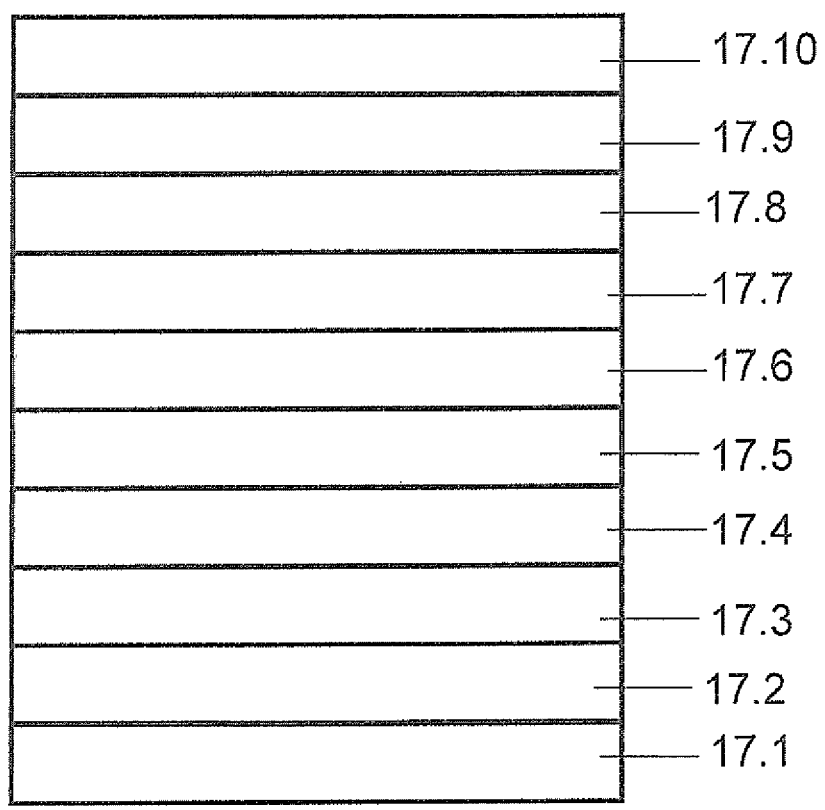

An organic light emitting device was prepared as shown in FIG. 17. The following layered structure was prepared:
17.1: Glass substrate
17.2: ITO (layer thickness: 90 nm)
17.3: HT2:PD1 (98.5:1.5) (50 nm)
17.4: a-NPD (20 nm)
17.5: compound 1d) (10 nm)
17.6: a-NPD:RE076 (95:5) (20 nm)
17.7: ET5 (10 nm)
17.8: ET2 (10 nm)
17.9: ET2:ND1 (92:8) (40 nm)
17.10: Ag The material of the electron blocking layer (EBL) 17.4 may alternatively be HT1, HT2 and HT3. The scattering layer 17.5 may also be made from the materials designated as compounds 1e) and 1f). In an alternative embodiment, the device may made without the scattering layer 17.5. The abbreviation RE076 refers to the material iridium(III)bis(2-methyldibenzo[f,h]quinoxaline) (acetylacetonate) which is commercially available.

Figure 18:
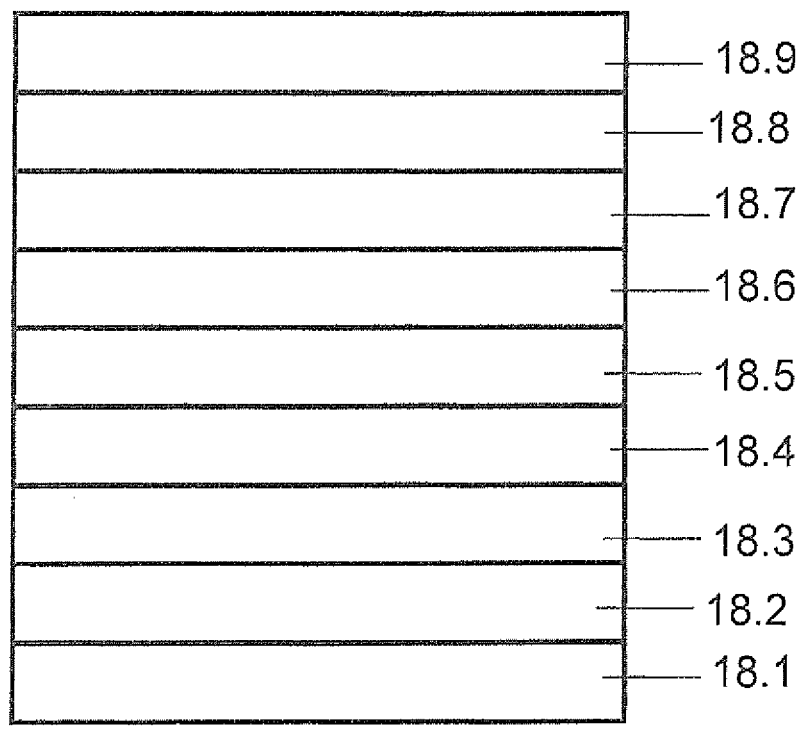

Another organic light emitting device was prepared as shown in FIG. 18. The self-crystallizing compound 1d) is arranged on the hole side of the stack. This is an example for a stack which does not allow the arrangement of the roughening layer on the electron transport side. The following layered structure was prepared (pii-stack):

18.1: Glass substrate
18.2: ITO (layer thickness: 90 nm)
18.3: HT2:PD1 (98.5:1.5) (50 nm)
18.4: a-NPD (20 nm)
18.5: compound 1d) (10 nm)
18.6: a-NPD:RE076 (95:5) (20 nm)
18.7: ET5 (60 nit) 18.8: LiQ (2 nm) 18.9: Al The material of the electron blocking layer (EBL) 18.4 may alternatively be HT1, HT2 and HT3. The scattering layer 18.5 may also be made from the materials designated as compounds 1e) and 1f).

The following table shows the external quantum efficiency (EQE) for different EBL materials with and without the compounds 1d) to 1f). External quantum efficiency has been measured in an integrating sphere at a constant current density of 3 mA/cm$^2$. The efficiency increases by 35 to 40%.

| EBL material | EQE without one of the compounds 1d) to 1 f) [%] | EQE with one of the compounds 1d) to 1 f) [%] | Enhancement of EQE |
|---|---|---|---|
| a-NPD | 19.3 | 27.0 | +40% |
| HT1 | 18.0 | 24.9 | +39% |
| HT2 | 19.7 | 26.5 | +35% |
| HT3 | 18.7 | 25.8 | +38% |

Figure 19:
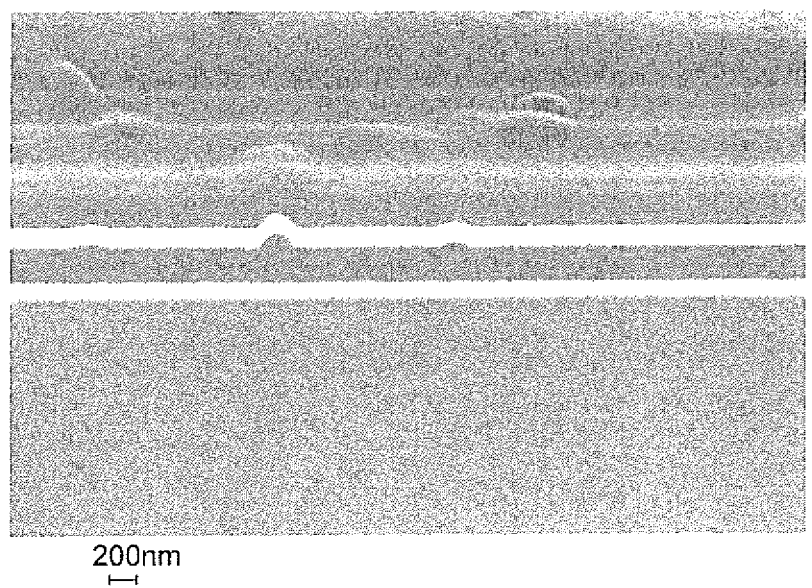

FIG. 19 shows a cross-section of an organic light emitting device with a layer of one of the compounds 1d) to 1f) (3 nm), wherein the layer is arranged adjacent to HT1. HT1 serves as electron blocking layer (EBL). The interface between the last organic layer and the cathode is corrugated. The image was obtained by SEM. It can be concluded from FIG. 19 that the outcoupling mechanism is the same as when the layer of one of the compounds 1d) to 1f) is arranged on the electron transport side of the device.

The features of the invention disclosed in the preceding description, the claims and the drawings can be of importance both individually and in any combination for the implementation of the invention in its various embodiments.

The invention claimed is:
1. An organic light emitting device, in a layered structure, comprising:
    a substrate,
    a bottom electrode,
    a top electrode, wherein the bottom electrode is arranged closer to the substrate than the top electrode,
    an electrically active region, the electrically active region comprising one or more organic layers and arranged between and in electrical contact with the bottom electrode and the top electrode,
    a light emitting region in the electrically active region, and
    a roughening layer, the roughening layer comprising a non-closed layer in the electrically active region, wherein the roughening layer is arranged between the light emitting region and the top electrode, and provides an electrode roughness to the top electrode on at least one of an inner side facing the electrically active region and an outer side of the top electrode facing away from the electrically active region, and wherein the roughening layer comprises a plurality of separated particles having a lateral dimension of from about 50 nm to about 500 nm and a height of at least 3 nm but less than 50 nm.

2. The organic light emitting device according to claim 1, wherein the roughening layer comprises an organic material.

3. The organic light emitting device according to claim 1, wherein the plurality of separated particles are randomly distributed over an underlying layer on which the roughening layer is deposited.

4. The organic light emitting device according to claim 1, wherein the top electrode is arranged on a top layer of the electrically active region which is roughened by the roughening layer provided underneath the top layer.

5. The organic light emitting device according to claim 1, wherein the roughening layer has a nominal layer thickness of from about 3 nm to about 50 nm.

6. The organic light emitting device according to claim 1, wherein the roughening layer is arranged on or is covered by an electrically doped charge carrier transport layer or arranged between two electrically doped charge carrier transport layers.

7. The organic light emitting device according to claim 1, wherein the roughening layer is arranged between and in direct contact with either an electron transport layer and a cathode, or a hole transport layer and an anode.

8. The organic light emitting device according to claim 5, wherein the nominal layer thickness is from about 3 nm to about 15 nm.

9. The organic light emitting device according to claim 1, wherein the plurality of separated particles are (i) randomly oriented, (ii) randomly distanced from each other, (iii) of random sizes, or (iv) a combination thereof.

10. A method of producing an organic light emitting device provided with a layered structure, the method comprising steps of:
    providing a substrate,
    depositing a bottom electrode on the substrate,
    forming an electrically active structure, wherein the step of forming comprises depositing a first organic semiconducting layer on the bottom electrode, depositing a non-closed roughening layer on the organic semiconducting layer, depositing a second organic semiconducting layer on the roughening layer, and depositing a top electrode over the electrically active structure, wherein the non-closed roughening layer is arranged between a light emitting region and the top electrode, and comprises a plurality of separated particles having a lateral dimension of from about 50 nm to about 500 nm and a height of at least 3 nm but less than 50 nm.

11. The method according to claim 10, wherein the roughening layer is deposited by vacuum thermal evaporation, and, during the vacuum deposition, a nominal thickness of the roughening layer is controlled by a quartz crystal monitor.

* * * * *